United States Patent
Yamada

(10) Patent No.: US 6,879,529 B2
(45) Date of Patent: Apr. 12, 2005

(54) SEMICONDUCTOR MEMORY HAVING A DEFECTIVE MEMORY CELL RELIEVING CIRCUIT

(75) Inventor: Junichi Yamada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/773,290

(22) Filed: Feb. 9, 2004

(65) Prior Publication Data

US 2004/0165456 A1 Aug. 26, 2004

Related U.S. Application Data

(62) Division of application No. 10/211,378, filed on Aug. 5, 2002, now Pat. No. 6,819,604.

(30) Foreign Application Priority Data

Aug. 3, 2001 (JP) .................................. 2001-236638

(51) Int. Cl.[7] ............................ G11C 7/00; G11C 29/00; G11C 11/22; G11C 8/00
(52) U.S. Cl. .................. 365/200; 365/145; 365/230.03; 365/230.06; 365/230.08; 365/238.5
(58) Field of Search ................................. 365/200, 145, 365/230.03, 238.5

(56) References Cited

U.S. PATENT DOCUMENTS

| | | | | |
|---|---|---|---|---|
| 4,459,685 A | * | 7/1984 | Sud et al. .................... | 365/200 |
| 4,601,019 A | * | 7/1986 | Shah et al. .................. | 365/200 |
| 5,227,997 A | * | 7/1993 | Kikuda et al. ......... | 365/189.08 |
| 5,268,866 A | | 12/1993 | Feng et al. | |
| 5,355,340 A | | 10/1994 | Coker et al. | |
| 5,379,259 A | | 1/1995 | Fujita | |
| 5,502,675 A | * | 3/1996 | Kohno et al. ................ | 365/200 |
| 6,040,999 A | * | 3/2000 | Hotta et al. ................. | 365/200 |
| 6,097,643 A | * | 8/2000 | Hasegawa .................... | 365/200 |
| 6,138,254 A | * | 10/2000 | Voshell ........................ | 714/710 |
| 6,154,389 A | | 11/2000 | Chung et al. | |
| 6,188,618 B1 | * | 2/2001 | Takase ........................ | 365/200 |
| 6,246,614 B1 | | 6/2001 | Ooishi | |

(Continued)

FOREIGN PATENT DOCUMENTS

| | | | |
|---|---|---|---|
| JP | 9-128991 A | 5/1997 | |
| JP | 2000-67594 A | 3/2000 | |
| JP | 2000-215687 A | 8/2000 | |
| JP | 2001273798 A | * 10/2001 | ........... G11C/29/00 |

*Primary Examiner*—David Nelms
*Assistant Examiner*—Ly Duy Pham
(74) *Attorney, Agent, or Firm*—Sughrue Mion, PLLC

(57) ABSTRACT

In a semiconductor memory incorporating therein a circuit for relieving a defective memory cell, a memory cell array constituted of a number of main memory cells $MC_{00}$ to $MC_{ij}$ is added with one column of redundant memory cells $MC_{0j+1}$ to $MC_{ij+1}$ and one word line of substitution information storing memory cells $MCRA_0$ to $MCRA_{j+1}$. In only a first cycle after the power supply is turned on, the substitution information DR0 to DRj is read out from the substitution information storing memory cells by use of a writing/reading circuit associated with the main memory cells, and is transferred to and held in a control circuit. In a second and succeeding cycles, the control circuit generates Y selection circuit control signals CS0 to CSj on the basis of the substitution information held in the control circuit, and a Y selection circuit is controlled by the control signals CS0 to CSj so as to selectively connect the columns other than a defective column to an input/output line. Thus, a chip area overhead attributable to the installation of the defective memory cell relief circuit is minimized. In addition, an address comparing circuit for a defective memory cell substitution is no longer necessary, and an access time overhead attributable to the address substitution operation does not occur.

4 Claims, 24 Drawing Sheets

U.S. PATENT DOCUMENTS

| | | |
|---|---|---|
| 6,373,758 B1 | 4/2002 | Hughes et al. |
| 6,373,759 B2 * | 4/2002 | Yamauchi .................. 365/200 |
| 6,407,950 B2 | 6/2002 | Ooishi |
| 6,452,859 B1 * | 9/2002 | Shimano et al. ....... 365/230.06 |
| 6,635,934 B2 | 10/2003 | Hidaka |
| 6,646,932 B2 * | 11/2003 | Kato et al. .................. 365/200 |
| 2002/0186606 A1 * | 12/2002 | Waller et al. ............... 365/201 |
| 2004/0010737 A1 * | 1/2004 | Merritt ....................... 714/711 |
| 2004/0022249 A1 * | 2/2004 | Katayama et al. ....... 370/395.7 |
| 2004/0085826 A1 * | 5/2004 | Sakata et al. ............... 365/200 |

* cited by examiner

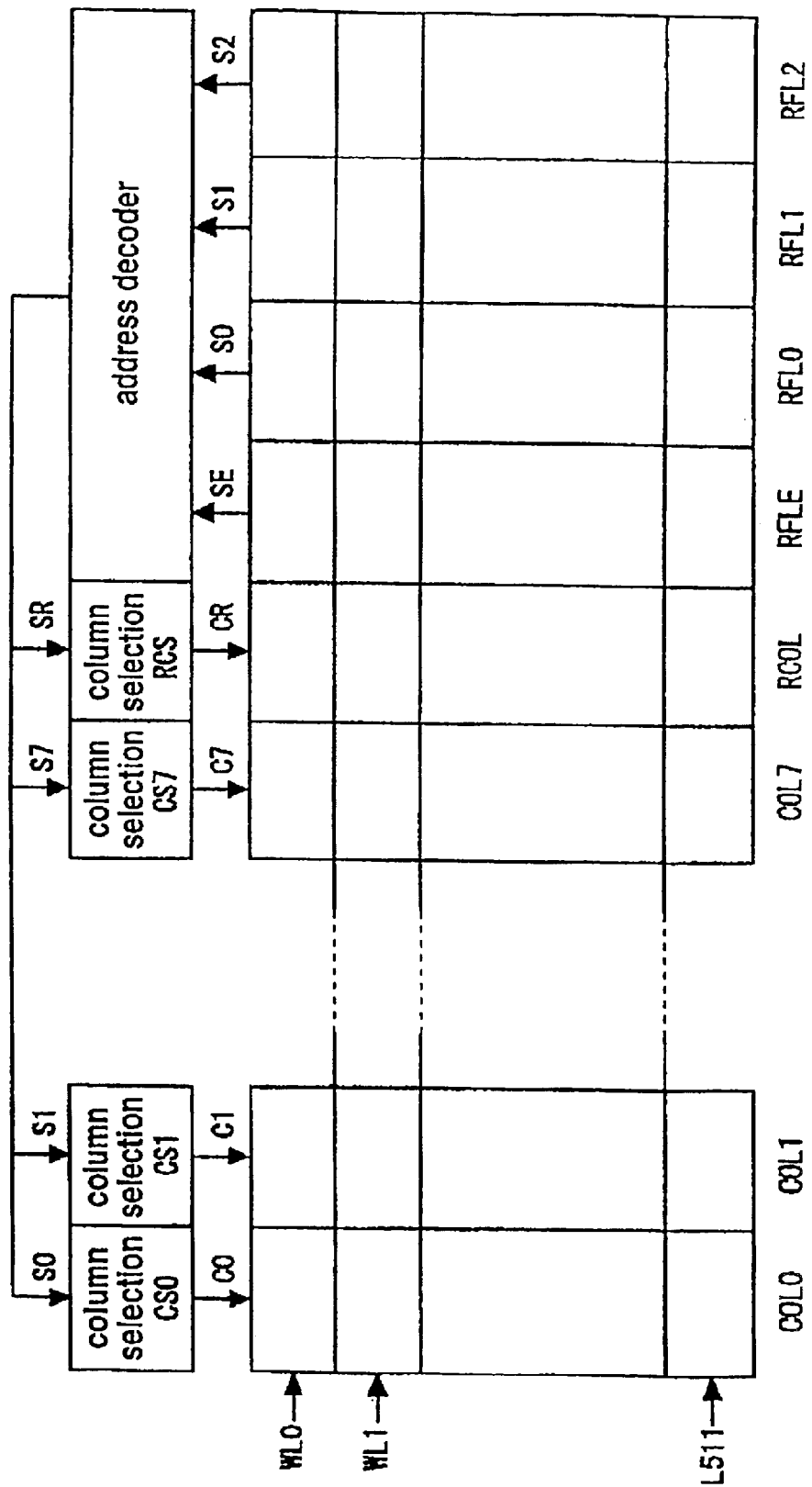

SEMICONDUCTOR MEMORY HAVING A DEFECTIVE MEMORY CELL RELIEVING CIRCUIT

This is a divisional of application Ser. No. 10/211,378 filed Aug. 5, 2002 now U.S. Pat. No. 6,819,604; the disclosure of which is incorporated herein by reference.

BACKGROUND OF THE INVENTION

The present invention relates to a semiconductor memory, and more specifically to a method for relieving a defective memory cell and a semiconductor memory incorporating therein a circuit for relieving a defective memory cell.

In a process for fabricating a semiconductor memory, defective memory cells occur often, and if the defective memory cells are fount out in an inspecting step, even if only one bit is defective, the whole of the memory chip is rejected. Therefore, particularly, in a semiconductor memory having a large memory capacity, redundant memory cells are previously provided to relieve the defective cells. In order to relieve the defective cells, it is necessary to provide on a chip a non-volatile memory for storing information for substituting a nondefective redundant memory cell for the defective memory cell found out in a chip test time.

In the prior art, in many cases, a memory of the information for substituting the nondefective redundant memory cell for the defective memory cell, is realized by a fuse (whether or not the fuse is broken) provided in the semiconductor memory.

Alternatively, a relief circuit has been proposed which uses a ferroelectric capacitor in place of the fuse. The relief circuit using a ferroelectric capacitor is disclosed by for example JP-A-2000-215687 or JP-A-09-128991.

Now, the redundant relief circuit disclosed in JP-A-09-128991 will be described with reference to FIGS. 22 and 23. In FIG. 22, an address signal supplied from an external of the chip is inputted to a row decoder 2205 and a column decoder 2202, and then, supplied to defective memory cell relief circuits 2206 and 2203. When a memory cell designated by the given address is a defective memory cell, an address translation is carried out by the defective memory cell relief circuits 2206 and 2203, so that a nondefective redundant memory cell is accessed.

FIG. 23 illustrates the defective memory cell relief circuit. In FIG. 23, a relief address storing circuit 2302 is constituted of "n+1" ferroelectric memory cells. The ferroelectric memory cell FE is constituted of one nMOS transistor and one ferroelectric capacitor. The relief address storing circuit 2302 stores an address of "n" bits and information of one bit indicative of substitution or nonsubstitution. A relief address writing circuit 2301 is used for writing a substitution information into the relief address storing circuit 2302.

A relief address reading circuit 2303 reads the substitution information from the relief address storing circuit 2302 and supplies the read-out substitution information into a redundant decoder 2310.

The redundant decoder 2310 compares the read-out substitution information with the address inputted to the chip. When coincidence is obtained, namely, when the address is replaced by another, the redundant decoder 2310 selects a redundant memory cell. On the other hand, when coincidence is not obtained, the redundant decoder 2310 allows a memory cell designated by the inputted address to be selected.

The redundant relief circuit disclosed in the above referred JP-A-09-128991 can reduce the number of steps in the test time, in comparison with the prior art relief address storing circuit using the fuse, since a trimmer or the like is not used, and since an electrical writing is possible. In addition, the redundant relief circuit disclosed in JP-A-09-128991 can reduce an occupying area for the whole of the relief circuit.

On the other hand, the above referred JP-A-2000-215687 discloses a memory device having a defective memory cell relief circuit in particular for a ferroelectric memory (FeRAM), in which a redundant file memory for storing the substitution information indicative of whether or not it is a defective cell to be replaced by a redundant cell, is constituted of memory cells having the same arrangement as that of main memory cells, and the redundant file memory is accessed as the same time as the main memory cells are accessed, so that a substitution information stored in the redundant file memory is read out when the main memory cells are accessed, and the defective memory cell is replaced by the redundant cell in accordance with the substitution information.

This memory device will be described with reference to FIG. 24. In FIG. 24, each of columns COL0 to COL7 and RCOL is constituted to have 8 bit line pairs. Substitution is carried out in units of column. The substitution information is stored in ferroelectric memory cells, which are located in the same word lines as those of the main memory cells.

The substitution information is read out as the same time as the main memory cells are accessed. The read-out substitution information is compared with the column address inputted, and when coincidence is obtained, redundant memory cells (of 8 bits since it is in units of column) is selected.

Since the substitution information storing cells are arranged in the same manner as that of the main memory cells, a writing/reading circuit can be shared with the main memory cells, so that a construction can be simplified. In addition, since the writing/reading operation of the main memory cells is the same as that of the substitution information storing cells, the testing becomes easy, and it is possible to write the substitution information after packaged. Furthermore, since the substitution information storing cells are arranged in the same word lines as those of the main memory cells, it is possible to set the substitution information of the defective memory cells in units of word line, and therefore, the degree of substitution is very high.

Incidentally, JP-A-2000-067594 discloses a non-volatile semiconductor memory device having a latch circuit latching, at a power-on time, an address data of a defective address storing part which stores an address of a defective memory cell.

However, the arrangement disclosed in the above referred JP-A-09-128991 so configured to store the substitution information by action of the ferroelectric memory cells is disadvantageous in that the whole of the relief circuit needs a large area and the access time becomes long.

In other words, since the fuses are replaced with the ferroelectric memory cells, the area for the fuses becomes greatly reduced. However, a dedicated writing/reading circuit becomes necessary, and further, it is necessary to provide on the chip a pad or pads for supplying data to written. The overhead of the chip area attributable to the installation of the relief circuit cannot become so small.

In addition, in order to replace the defective memory cell, the address inputted to the chip is supplied to the defective memory relief circuit once, so that the address comparison is carried out within the defective memory relief circuit, and then, if the inputted address is to be replaced, the address translation is carried out, and thereafter, a redundant memory cell is selected finally. Therefore, the access time becomes long.

On the other hand, the memory device disclosed in the above referred JP-A-2000-215687 is also disadvantageous in the chip area and in the access time. In addition, it has another problem in which the characteristics of the ferroelectric capacitor is deteriorated. Namely, in this prior art construction, the substitution information storing cells are located in the same array and in the same word lines as those of the main memory cells, and the substitution information stores the column address of the defective memory cells. In the case that the memory cell array is constituted of 8 columns (8 bit line pairs×8 columns=64 bit line pairs), the redundant memory cells are organized in one column (8 bits), and therefore, at least three bits are required to indicate the column address, and a bit indicative of substitution or nonsubstitution is required, so that at least four bits are required in total. Accordingly, only in the memory cell array excluding a peripheral circuit for the substitution, the area overhead reaches 18% or more. Namely, the area overhead attributable to the installation of the redundant circuit is very large.

Furthermore, since the substitution information storing cells are located in the same word lines as those of the main memory cells, the substitution has not yet been achieved at the moment a signal voltage read out from the memory cell has been amplified by a sense amplifier. The read-out column address is decoded, and compared with the given column address, and thereafter, the substitution operation is carried out, so that a column selection signal (S0 to SR) is generated. Comparing with the case in which the substitution is not carried out, an overhead is inevitably generated in the access time. In addition, since the substitution information is read out in every memory access, the deterioration in characteristics of the ferroelectric capacitors is unavoidable. Namely, there is possibility that an erroneous substitution occurs because of the deterioration in characteristics of the substitution information storing cells.

BRIEF SUMMARY OF THE INVENTION

Accordingly, it is an object of the present invention to provide a semiconductor memory which has overcome the above mentioned problems of the prior art.

Another object of the present invention is to provide a semiconductor memory which has minimized the area overhead and the access time overhead attributable to the installation of the defective memory cell relief circuit, whereby a semiconductor memory having an elevated chip yield of production and an increased reliability can be obtained.

The above and other objects of the present invention are achieved in accordance with the present invention by a semiconductor memory including a memory cell array constituted of a number of memory cells arranged in the form of a matrix having a number of rows and a number of columns, and a defective memory cell relief means, wherein the memory cell array includes main memory cells arranged in the form of a matrix having a number of rows and a number of columns, at least one row of substitution information storing memory cells and at least one column of redundant memory cells, and the defective memory cell relief means includes a means for operating, in place of a column including a defective memory cell, a non-defective column adjacent to the column including the defective memory cell.

Specifically, the defective memory cell relief means includes a means for inhibiting access to the column including the defective memory cell in accordance with the content of the substitution information storing memory cells, a means for operating, in place of the column including a defective memory cell within the main memory cells, a non-defective column within the main memory cells, adjacent to the column including the defective memory cell, and a means for compensating shortage in the main memory cells with the redundant memory cells.

More specifically, the defective memory cell relief means includes a control circuit for generating a control signal on the basis of the content of the substitution information storing memory cells.

The defective memory cell relief means preferably further includes a Y selection circuit receiving a Y selection signal and the control signal for selecting one column of the columns in the memory cell array to connect a bit line of the selected column to an input/output line.

Alternatively, the control circuit includes at least "n" bits of volatile memory cells for storing the substitution information of "n" bits stored in one row of substitution information storing memory cells.

The control circuit can further include a decoder receiving the substitution information stored in the at least "n" bits of volatile memory cells, for generating the control signal.

According to anther aspect of the present invention, there is provided a semiconductor memory including first and second memory cell arrays each constituted of a number of memory cells arranged in the form of a matrix having a number of rows and a number of columns, and a defective memory cell relief means, wherein each of the first and second memory cell arrays includes main memory cells arranged in the form of a matrix having a number of rows and a number of columns, at least one row of substitution information storing memory cells and at least one column of redundant memory cells, the substitution information for the first memory cell array being stored in the substitution information storing memory cells in the second memory cell array, the substitution information for the second memory cell array being stored in the substitution information storing memory cells in the first memory cell array, so that when the first memory cell array is accessed, substitution information is simultaneously read out from the substitution information storing memory cells in the second memory cell array in order to relieve a defective memory cell within the first memory cell array.

According to still anther aspect of the present invention, there is provided a semiconductor memory including a memory cell array constituted of a number of memory cells arranged in the form of a matrix having a number of rows and a number of columns, and a defective memory cell relief means, wherein the memory cell array includes main memory cells arranged in the form of a matrix having a number of rows and a number of columns and at least one column of redundant memory cells, and the defective memory cell relief means includes at least "n" bits of ferroelectric non-volatile memory cells, for storing substitution information of "n" bits.

In one embodiment of the semiconductor memory, each of the at least "n" bits of ferroelectric non-volatile memory cells comprises two ferroelectric capacitors and at least four transistors.

For example, only the substitution information storing memory cells are a non-volatile memory cell, or alternatively, the main memory cells, the redundant memory cells and the substitution information storing memory cells are a non-volatile memory cell, or specifically, a ferroelectric non-volatile memory cell.

According to a further aspect of the present invention, there is provided a semiconductor memory comprising a memory cell array including main memory cells arranged in the form of a matrix having a number of rows and a number of columns, at least one row of substitution information storing memory cells and at least one column of redundant memory cells, the substitution information storing memory cells being constituted of a rewritable non-volatile memory cell;

a Y selection circuit associated with the memory cell array and receiving a Y selection signal to connect an input/output line to a bit line of the column designated by the Y selection signal;

a control circuit for generating a control signal in response to substitution information which is read out from the substitution information storing memory cells just after a power supply is turned on for the semiconductor memory (namely, an ordinary reading/writing operation) and which indicates that a column including a defective memory cell should be replaced with another column having no defective memory cell, the control signal being supplied to the Y selection circuit for inhibiting access to the column including the defective memory cell and for replacing the column including the defective memory cell by one column of the other columns and the at least one column of redundant memory cells.

In one embodiment of the semiconductor memory, each of the at least one row of substitution information storing memory cells is constituted of for example a ferroelectric memory cell (FeRAM), which for example comprises a pair of ferroelectric capacitors each having one end connected to a plate line, and a pair of cell transistors connected between a pair of complementary bit lines and the other end of the pair of ferroelectric capacitors, respectively, a gate of each of the pair of cell transistors being connected to a word line. In this connection, each of the main memory cells can be formed of a ferroelectric memory cell.

With the above mentioned arrangement, since the at least one row of substitution information storing memory cells are added to the main memory cells arranged in the form of a matrix having a number of rows and a number of columns, and since only the one row of substitution information storing memory cells store the substitution information, the area overhead of the memory cell array is minimized. In addition, since the substitution information is read out from the substitution information storing memory cells only one time just after a power supply is turned on for the semiconductor memory, it is possible to avoid the characteristics deterioration, of the substitution information storing memory cells which may be formed of the ferroelectric memory cell.

Furthermore, since the substitution of the defective memory cell (namely, the column including the defective memory cell) is completed before the Y selection signal (column selection signal) is supplied to the Y selection circuit, no overhead occurs in the access time.

Therefore, the present invention provides a highly reliable semiconductor memory device having a minimized area overhead and no access time overhead.

Specifically, the Y selection circuit receiving the Y selection signal and the control signal, is so configured that when the column designated by the Y selection signal is the column including the defective memory cell, the Y selection circuit selects a column adjacent to the column designated by the Y selection signal, and connects the input/output line to a bit line of the selected column adjacent to the column designated by the Y selection signal.

In one embodiment of the semiconductor memory, the Y selection circuit is controlled by the control signal to select the column designated by the Y selection signal, until a column just before the column including the defective memory cell, and to select, a column adjacent to the column designated by the Y selection signal for the column designated by the Y selection signal and succeeding columns.

In a specific embodiment of the semiconductor memory, the memory cell array includes (0)th to (j)th columns of main memory cells and a (j+1)th column of redundant memory cells, and the Y selection circuit includes:

a first series circuit composed of a first Y switch and a first control switch connected in series between the input/output line and a bit line of a (k)th column (k=1 to (j+1)) excluding the (0)th column, the first Y switch being on-off controlled by a Y selection signal corresponding to a (k−1)th column, and the first control switch being on-off controlled by a control signal CS(k−1) generated from the data read out from the substitution information storing memory cell corresponding to the (k−1)th column, and a second series circuit composed of a second Y switch and a second control switch connected in series between the input/output line and a bit line of a (k−1)th column excluding the (j+1)th column, the second Y switch being on-off controlled by the Y selection signal corresponding to the (k−1)th column, and the second control switch being on-off controlled by an inverted signal of the control signal CS(k−1) generated from the data read out from the substitution information storing memory cell corresponding to the (k−1)th column.

The substitution information storing memory cells are read and written by use of a writing/reading circuit for the main memory cells.

Each of the substitution information storing memory cells includes a ferroelectric capacitor having one end connected to a plate line and a cell transistor connected between a bit line and the other end of the ferroelectric capacitor, the cell transistor having a gate connected to a word line.

Each of the main memory cells includes a ferroelectric capacitor having one end connected to a plate line and a cell transistor connected between a bit line and the other end of the ferroelectric capacitor, the cell transistor having a gate connected to a word line.

The control circuit includes a memory circuit for receiving and holding the substitution information read out from the one row of substitution information storing memory cells, and the control circuit generates the control signal on the basis of the substitution information held in the memory circuit.

Specifically, in response to one Y selection signal, a plurality of bit lines are simultaneously selected and connected to a plurality of input/output lines, and when the selected plurality of bit lines includes a bit line connected to the column including the defective memory cell, the a bit line connected to the column including the defective memory cell is not selected, and a bit line of a column adjacent to the column including the defective memory cell is selected.

Alternatively, the substitution information includes a plurality of bits indicative of an address of one column within the memory cell array excluding the column of redundant memory cells, and an information bit indicative of substitution or non-substitution, and word lines of the memory cell array excluding the row of substitution information storing memory cells are divided into a plurality of groups of word lines, and one substitution information is allocated to each one group of word lines, so that a substitution column can be different from one group of word lines to another group of word lines, whereby even if a plurality of defective memory cells exist in different columns, the defective memory cells can be relieved.

For example, the control circuit selects substitution information for a group of word lines to be accessed, from the substitution information read out from the one row of substitution information storing memory cells, excluding the column of redundant memory cells, and the control circuit generates the control signal on the basis of the selected substitution information.

Furthermore, substitution information for a group of word lines to be accessed is selected on the basis of a signal obtained by decoding a bit or bits identifying the plurality of groups of word lines, of an X address, and the selected substitution information is supplied to a decode circuit, which generates the control signal to the Y selection circuit.

In addition, the control circuit includes memory cells of the number corresponding to the number of columns in the memory cell array excluding the column of redundant memory cells, each of the memory cells storing the data read out from a corresponding memory cell of the row of substitution information storing memory cells, and the substitution information for a group of word lines to be accessed is selected from the substitution information stored in the memory cells of the control circuit, on the basis of a signal obtained by decoding a bit or bits identifying the plurality of groups of word lines, of an X address, and the selected substitution information is supplied to the decode circuit.

According to a further aspect of the present invention, there is provided a semiconductor memory comprising a memory cell array divided into a plurality of sub-arrays coupled through a local bus, each of the sub-arrays including a number of main memory cells arranged in the form of a matrix having a number of rows and a number of columns, at least one row of substitution information storing memory cells and at least one column of redundant memory cells, each of the sub-arrays being associated with a Y selection circuit and a plurality of sense amplifiers each provided for a bit line of one corresponding column, wherein in the bit line of each column, a transfer gate is inserted between the substitution information storing memory cells and the main memory cells and the redundant memory cells, and is controlled by a separation control signal to separate the main memory cells and the redundant memory cells from the associated sense amplifiers and the substitution information storing memory cells, wherein a pair of the sub-arrays are mated so that the substitution information storing memory cells in each of the pair of sub-arrays store substitution information for the other of the pair of sub-arrays, and when one of the pair of sub-arrays is read out, the substitution information for the one of the pair of sub-arrays is read out from the substitution information storing memory cells in the other of the pair of sub-arrays while separating the main memory cells and the redundant memory cells in the other of the pair of sub-arrays from the associated sense amplifiers and the substitution information storing memory cells in the other of the pair of sub-arrays by turning off the transfer gates in the other of the pair of sub-arrays, and the read-out substitution information is transferred through the local bus, as a control signal, to the Y selection circuit associated with the one of the pair of sub-arrays, so that the Y selection circuit associated with the one of the pair of sub-arrays receives a Y selection signal and the control signal, to connect the bit line of the column designated by the Y selection signal to an input/output line when the control signal indicates that the column designated by the Y selection signal is not a column including a defective memory cell, and to connect the input/output line to a column adjacent to the column designated by the Y selection signal when the control signal indicates that the column designated by the Y selection signal is a column including a defective memory cell.

Specifically, word lines of each sub-array excluding the row of substitution information storing memory cells are divided into a plurality of groups of word lines, and one substitution information is allocated to each one group of word lines, so that a substitution column can be different from one group of word lines to another group of word lines, whereby even if a plurality of defective memory cells exist in different columns, the defective memory cells can be relieved. And, the semiconductor memory includes a selection circuit for selecting substitution information for a group of word lines to be accessed, on the basis of a signal obtained by decoding a bit or bits identifying the plurality of groups of word lines, of an X address, and a decode circuit receiving the selected substitution information for generating the control signal which is supplied through the local bus to the Y selection circuit of the other sub-array.

According to a further aspect of the present invention, there is provided a semiconductor memory comprising:

a memory cell array including a number of main memory cells arranged in the form of a matrix having a number of rows and a number of columns and at least one column of redundant memory cells;

a plurality of sense amplifiers each provided for a bit line of one corresponding column in the memory cell array;

a Y selection circuit associated with the memory cell array;

a control circuit including a plurality of substitution information storing memory cells for generating, on the basis of substitution information read out from the substitution information storing memory cells, a control signal to the Y selection circuit for inhibiting access to a column including a defective memory cell and for replacing the column including the defective memory cell by one column of the other columns and the at least one column of redundant memory cells, wherein when a power supply is turned on, the substitution information is read out from the substitution information storing memory cells, and the Y selection circuit receiving a Y selection signal and the control signal, connects the bit line of the column designated by the Y selection signal to an input/output line when the control signal indicates that the column designated by the Y selection signal is not a column including a defective memory cell, and to connect the input/output line to a column including no defective memory cell when the control signal indicates that the column designated by the Y selection signal is a column including a defective memory cell.

Each of the substitution information storing memory cells included in the control circuit can be formed of a ferroelectric memory cell, or alternatively, another type of non-volatile memory cells such as a EEPROM cell, a flash memory cell or a MRAM (magnetic random access memory) cell.

The above and other objects, features and advantages of the present invention will be apparent from the following description of preferred embodiments of the invention with reference to the accompanying drawings.

BRIEF DESCRIPTION OF THE DRAWINGS

FIG. 24 is a circuit layout diagram illustrating the prior art defective memory cell relief circuit.

DETAILED DESCRIPTION OF THE INVENTION

Now, embodiments of the present invention will be described with reference to the drawings.

Figure 1:
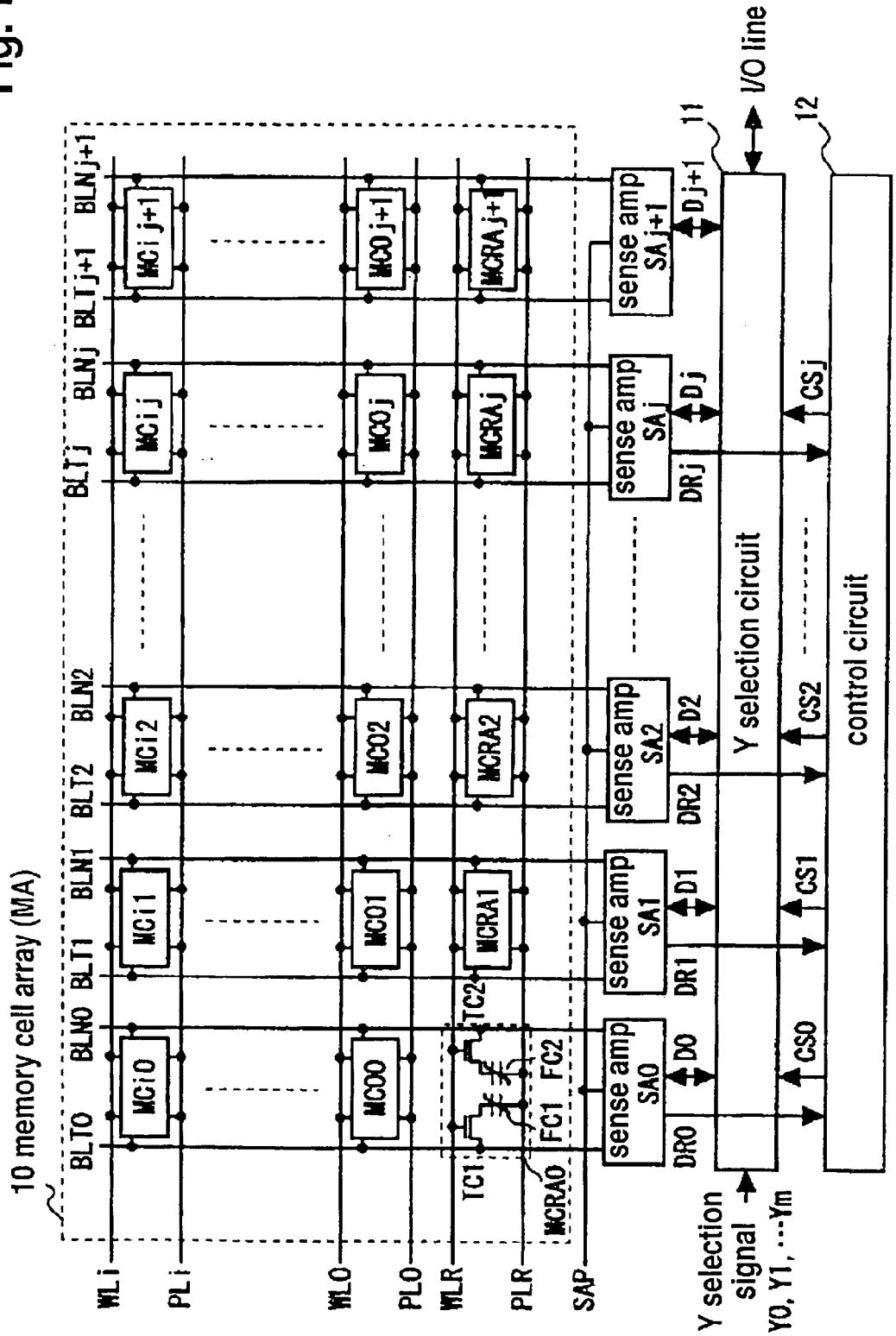
FIG. 1 is a block diagram of a first embodiment of the semiconductor memory device in accordance with the present invention.

Referring to FIG. 1, there is shown a block diagram of a first embodiment of the semiconductor memory device in accordance with the present invention. The first embodiment includes a memory cell array (MA) 10 constituted of a number of main memory cells MC00 to MCij arranged in the form of a matrix having a number of rows and a number of columns, one column of redundant memory cells $MC_{0j+1}$ to $MC_{ij+1}$, and one word line of substitution information storing memory cells $MCRA_0$ to $MCRA_{j+1}$.

The substitution information storing memory cell (for example, MCRA0) is constituted of two ferroelectric capacitors FC1 and FC2 and two cell transistors TC1 and TC2.

As shown in FIG. 1, each of the two ferroelectric capacitors FC1 and FC2 has one end connected to a plate line PLR. The other end of the ferroelectric capacitor FC1 is connected to a source of a corresponding cell transistor TC1, and the other end of the ferroelectric capacitor FC2 is connected to a source of a corresponding cell transistor TC2.

A gate of each of the cell transistors TC1 and TC2 is connected to a word line WLR. A drain of the cell transistor TC1 is connected to a bit line BLT0, and a drain of the cell transistor TC2 is connected to a bit line BLN0.

The other memory cells $MC_{00}$ to $MC_{ij+1}$ and MCRA1 to $MCRA_{j+1}$ have the same circuit construction and the same cell size as those of the substitution information storing memory cell MCRA0.

Sense amplifiers SA0 to $SA_{j+1}$ are connected to bit line pairs BLT0 and BLN0 to $BLT_{j+1}$ and $BLN_{j+1}$, respectively, each of which is connected to a plurality of associated memory cells in a corresponding column. One column is constituted of one bit line pair and one sense amplifier.

A Y selection circuit 11 connects at least one sense amplifier (SA0 to $SA_{j+1}$) to an I/O (input/output) line in accordance with at least one Y selection signal Y0 to Ym, so that data read out from the memory cell can be outputted through the I/O line to an external, or alternatively, data supplied from the external can be written into the memory cell.

A control circuit 12 controls the Y selection circuit 11 in accordance with the contents of the substitution information storing memory cells, to inhibit access to the column to which a defective memory cell is connected, and to substitute a column to which a nondefective cell is connected.

With this arrangement, since one column of redundant memory cells are provided, the substitution can be carried out in units of one column.

Ordinarily, a defective memory cell relief circuit is used to relieve several bits of defective cells in the chip. In addition, in a large capacity memory of a large chip size of a megabit class or more, the memory cell array is divided into several sub-arrays, in order to prevent the drop of an operation speed and the increase of a consumed electric current.

According to the present invention, it is possible to provide a substitute column for each sub-array. Therefore, even if the memory capacity is increased, it is possible to feasibly relieve a defective bit.

Figure 2:
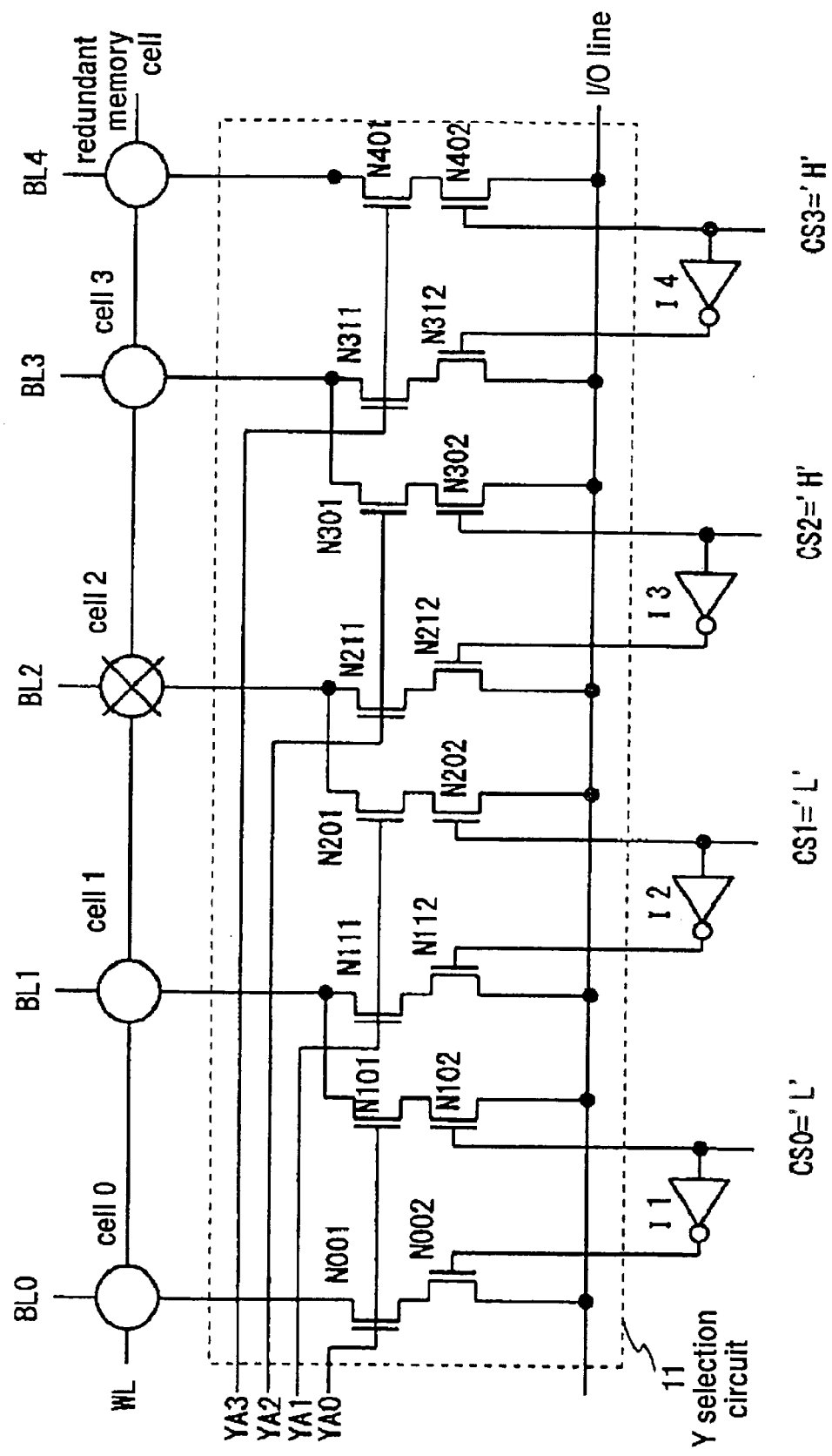
FIG. 2 is a circuit diagram illustrating a Y selection circuit in the first embodiment of the semiconductor memory device.

The Y selection circuit 11 can be realized in for example a circuit construction as shown in FIG. 2. In FIG. 2, only for simplification of the description, the sense amplifiers are omitted, and only one bit line and only one I/O line are shown in place of a pair of complementary bit lines (BLT and BLN) and a pair of complementary I/O lines, respectively.

The bit line BL0 connected to the sense amplifier SA0 is connected to the I/O line through a Y switch N001 and a control switch N002 which are connected in series and which are formed of an nMOS transistor. The Y selection signal YA0 is connected to a gate of the Y switch N001, and a control signal CS0 is connected through an inverter I1 to a gate of the Y switch N002.

The bit line BL1 connected to the sense amplifier SA1 is connected to the I/O line through a Y switch N101 and a control switch N102 which are connected in series and which are formed of an nMOS transistor, and also connected to the I/O line through a Y switch N111 and a control switch N112 which are connected in series and which are formed of an nMOS transistor. The Y selection signal YA0 is connected to a gate of the Y switch N101, and the control signal CS0 is connected directly to a gate of the Y switch N102. The Y selection signal YA1 is connected to a gate of the Y switch N111, and a control signal CS1 is connected through an inverter I2 to a gate of the Y switch N112.

The bit line BL2 connected to the sense amplifier SA2 is connected to the I/O line through a Y switch N201 and a control switch N202 which are connected in series and which are formed of an nMOS transistor, and also connected to the I/O line through a Y switch N211 and a control switch N212 which are connected in series and which are formed of an nMOS transistor. The Y selection signal YA1 is connected to a gate of the Y switch N201, and the control signal CS1 is connected directly to a gate of the Y switch N202. The Y selection signal YA2 is connected to a gate of the Y switch N211, and a control signal CS2 is connected through an inverter I3 to a gate of the Y switch N212.

The bit line BL3 connected to the sense amplifier SA3 is connected to the I/O line through a Y switch N301 and a control switch N302 which are connected in series and which are formed of an nMOS transistor, and also connected to the I/O line through a Y switch N311 and a control switch N312 which are connected in series and which are formed of an nMOS transistor. The Y selection signal YA2 is connected to a gate of the Y switch N301, and the control signal CS2 is connected directly to a gate of the Y switch N302. The Y selection signal YA3 is connected to a gate of the Y switch N311, and a control signal CS3 is connected through an inverter I4 to a gate of the Y switch N312.

The bit line BL4 connected to the sense amplifier SA4 is connected to the I/O line through a Y switch N401 and a control switch N402 which are connected in series and which are formed of an nMOS transistor. The Y selection signal YA4 is connected to a gate of the Y switch N401, and the control signal CS3 is cornected directly to a gate of the Y switch N402.

Figure 3:
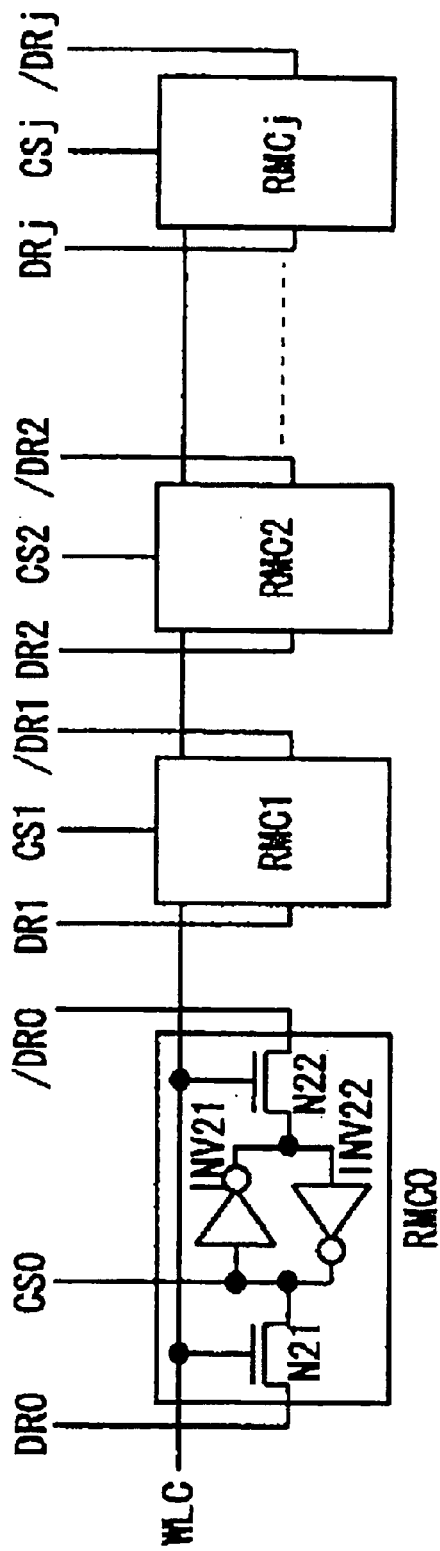
FIG. 3 is a circuit diagram illustrating a control circuit in the first embodiment of the semiconductor memory device.

Referring to FIG. 3, there is shown a block diagram of one example of the control circuit 12. The control circuit 12 includes one or more volatile memory cells RMC0 to RMCj for holding the content of the substitution information. The control circuit 12 outputs the control signals CS0 to CSj to the Y selection circuit 11. The memory cell RMC0 includes two inverters INV21 and INV22 each having an input connected to an output of the other inverter so as to form a latch circuit, and transfer gate nMOS transistors N21 and N22 having a gate connected to a write control line WLC. One end of the transfer gate nMOS transistors N21 and N22 are respectively connected to a pair of complementary output lines DR0 and /DR0 of the sense amplifier connected to the substitution information storing memory cell MCRA0. The other end of the transfer gate nMOS transistors N21 and N22 are respectively connected to two connection nodes of the inverters INV21 and INV22 connected to each other in opposite direction. The control signal CS0 is outputted from the connection node between the nMOS transistor N21 and the inverters. The other memory cells RMCk (k=1 to j) have a similar construction, but receive a pair of outputs DRk and /DRk (k=1 to j) of the associated sense amplifier, and output the control signal CSk (k=1 to j), respectively.

As shown in FIG. 2, in the case that the second column includes a defective memory cell (cell 2), the substitution information is previously programmed to the effect that the (0)th and first control signals CS0 and CS1 take a low level "L" and the other control signals take a high level "H".

Figure 4:
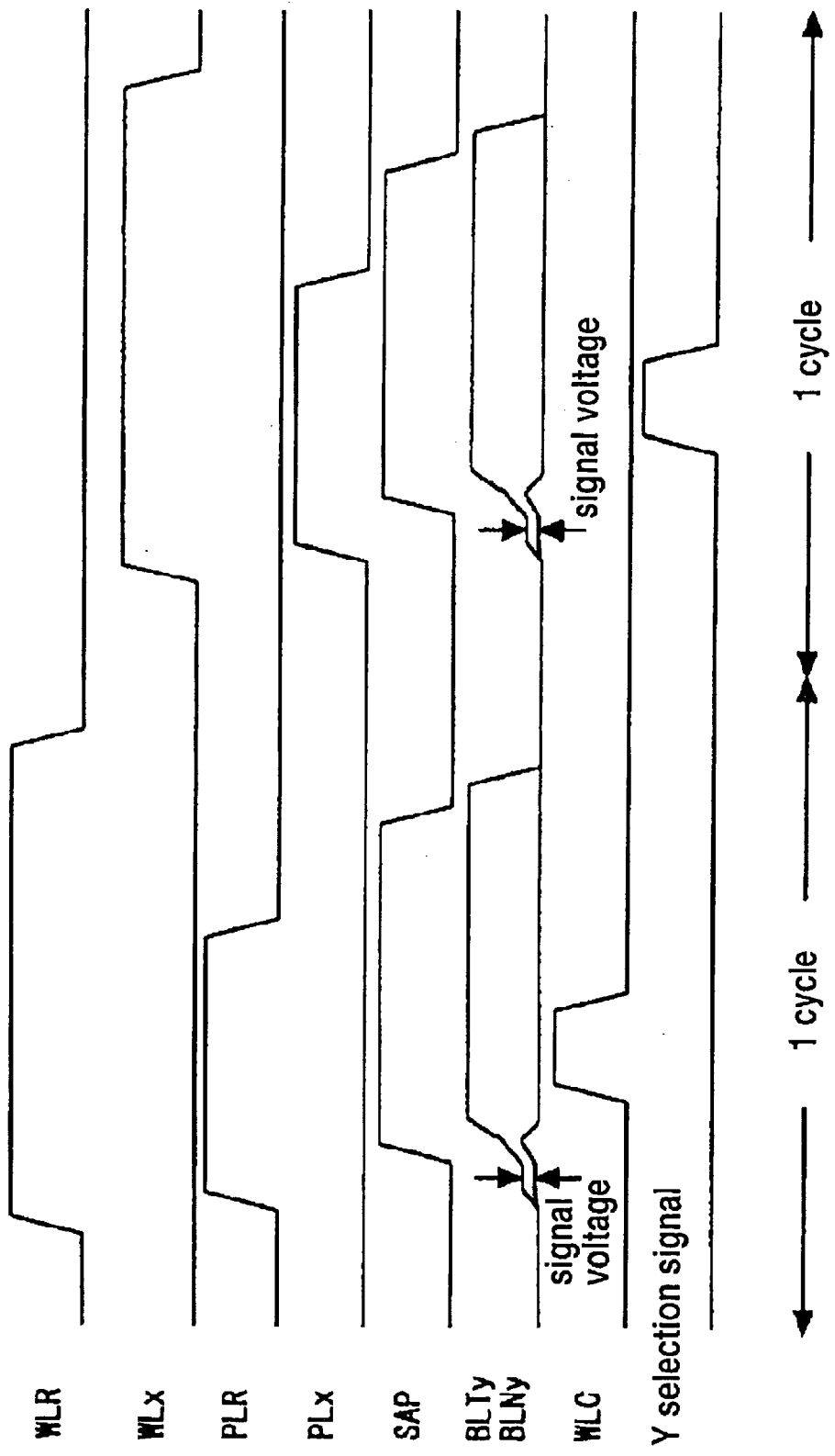
FIG. 4 is a timing chart illustrating the operation of the first embodiment of the semiconductor memory device.

Referring to FIG. 4, there is shown a timing chart illustrating the operation of the circuit shown in FIG. 1. FIG. 4 shows respective waveforms of the word line WLR connected to the substitution information storing memory cells shown in FIG. 1, the word line WLx (x=1 to "i") connected to the main memory cells, the plate line PLR connected to the substitution information storing memory cells, the plate line PLx (x=1 to "i") connected to the main memory cells, the sense amplifier activation signal SAP, a (y)th pair of bit lines BLTy and BLNy (y=1 to "j+1"), the write control line WLC (FIG. 3), and the Y selection signal.

After the power supply is turned on for the chip and the power supply voltage has become stabilized, the substitution information storing memory cells are read out only one time. The word line WLR connected to the substitution information storing memory cells is selected, and the plateline PLR connected to the substitution information storing memory cells is brought to a high level "H", the content of a (y)th memory cell in the one word line of substitution information storing memory cells MCRA0 to MCRA$_{j+1}$ is read out to the (y)th pair of bit lines BLTy and BLNy, as a signal voltage.

Thereafter, the sense amplifier activation signal SAP is brought to a high level "H", so that the read-out signal voltage is amplified.

The read-out and amplified signal voltage is transferred through the signal line DRy to the control circuit 12, and then, is written into the memory circuit RMCy in the control circuit 12 by bringing the write control signal WLC into a high level "H".

In a second and succeeding cycles, the main memory cells are accessed, and the substitution information storing memory cells are not accessed.

In the case of the column substitution as shown in FIG. 2, the third column and the redundant column operate as the second column and the third column, respectively, in accordance with the control signals. Since the control signal CS1 is at the low level "L", the switch N202 is off, and since the control signal CS2 is at the high level "H", the switch N212 is off. Therefore, the bit line BL2 connected to the cell 2 is separated from the I/O line. Thus, when the Y selection signal YA2 is at the high level "H", the Y switch N301 is turned on, so that the bit line BL3, namely, the third column is selected. When the Y selection signal YA3 is at the high level "H", the Y switch N401 is turned on, so that the bit line BL4, namely, the fourth column (redundant column) is selected.

Thus, the substitution information recorded by the fuses in the prior art is recorded in the ferroelectric memory cells (MCRA0 to MCRA$_{j+1}$), and the ferroelectric memory cells for storing the substitution information, namely, the substitution information cells, are located in the memory cell array 10, with the result that the reading/writing of the substitution information cells can be carried out similarly to the main memory cells (not-redundant memory cells). Accordingly, it is possible to minimize the area overhead attributable to the installation of the dedicated writing/reading circuits.

Furthermore, the substitution information cells (MCRA0 to MCRA$_{j+1}$) are located on one word line WLR, and the substitution information is read out only one time (first cycle) when the power supply is turned on for the chip, with the result that there occurs no characteristics deterioration in the substitution information cells due to fatigue or imprint.

Generally, a time of several ten microseconds to several hundred microseconds is needed after the power supply is turned on until the power supply voltage becomes stabilized. Since the reading/writing cycle of the ferroelectric memory is as fast as 100 nanoseconds, the first and only one access to the substitution information cells does not result in the drop of the performance of the whole system.

Furthermore, for the substitution of the defective column, since the substitution information is previously read out to control the Y selection circuit so as to replace the defective column by a nondefective column, it is not necessary to compare the Y selection signal with the address of the defective column. Accordingly, the address comparing circuit is no longer necessary, so that there occurs no overhead in the access time attributable to the address substitution operation.

In conclusion, according to the present invention, it is possible to realize the defective memory cell relief circuit having a minimized increase in the chip area attributable to the installation of the redundant circuit and having a high reliability and a high operation speed, and capable of greatly improving the yield of production of the ferroelectric memory chip.

Figure 5:
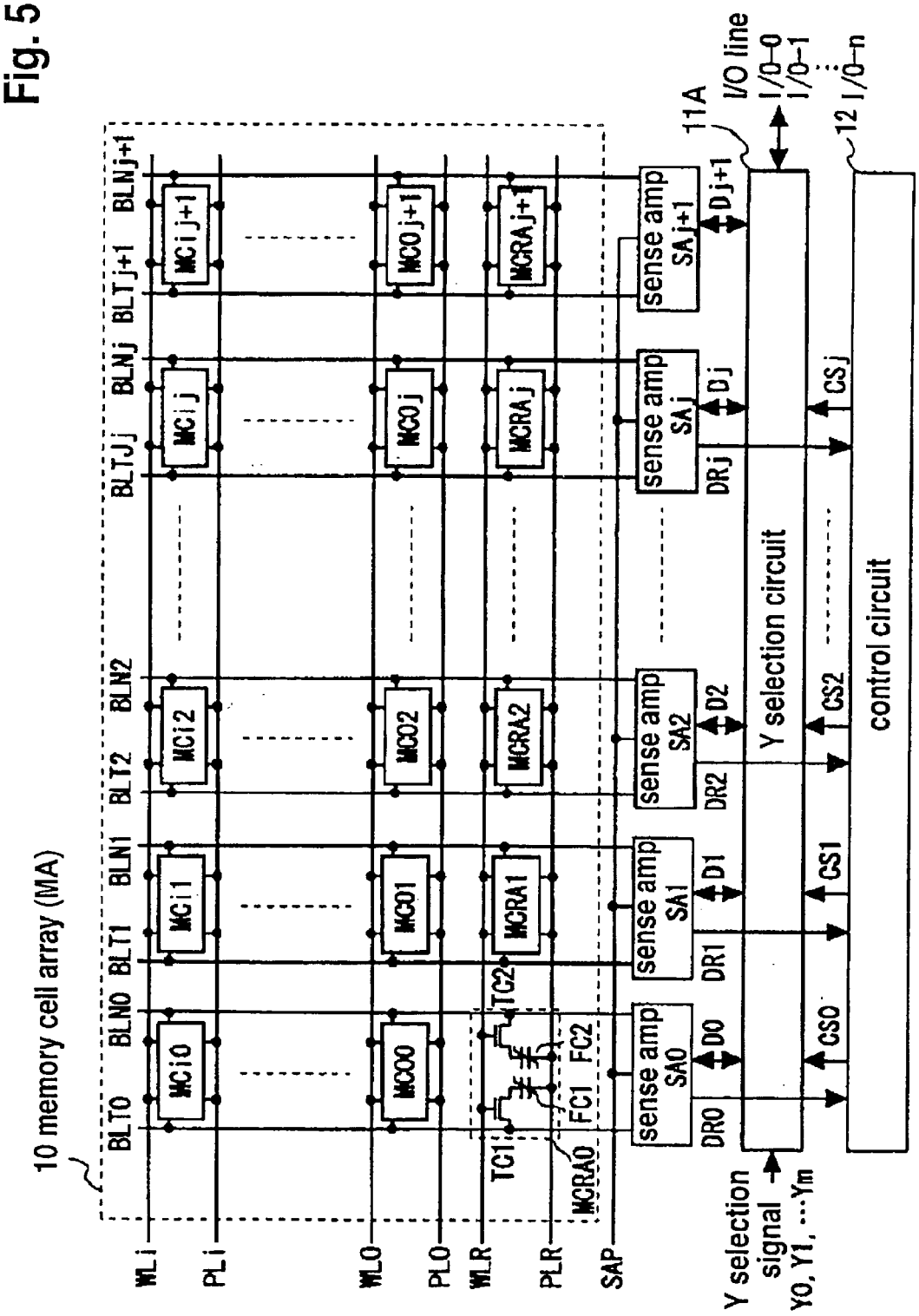
FIG. 5 is a block diagram of a second embodiment of the semiconductor memory device in accordance with the present invention.

Now, a second embodiment of the semiconductor memory in accordance with the present invention will be described. FIG. 5 is a block diagram of the second embodiment of the semiconductor memory in accordance with the present invention. In FIG. 5, elements corresponding to those shown in FIG. 1 are given the same reference numbers, and explanation will be omitted. In the second embodiment, the memory cell array 10 and the control circuit 12 have the same construction of those included in the first embodiment. In addition, the defective cell substitution operation is the same as that in the first embodiment. However, a Y selection circuit 11A has a construction different from that of the Y selection circuit 11 in the first embodiment.

Figure 6:
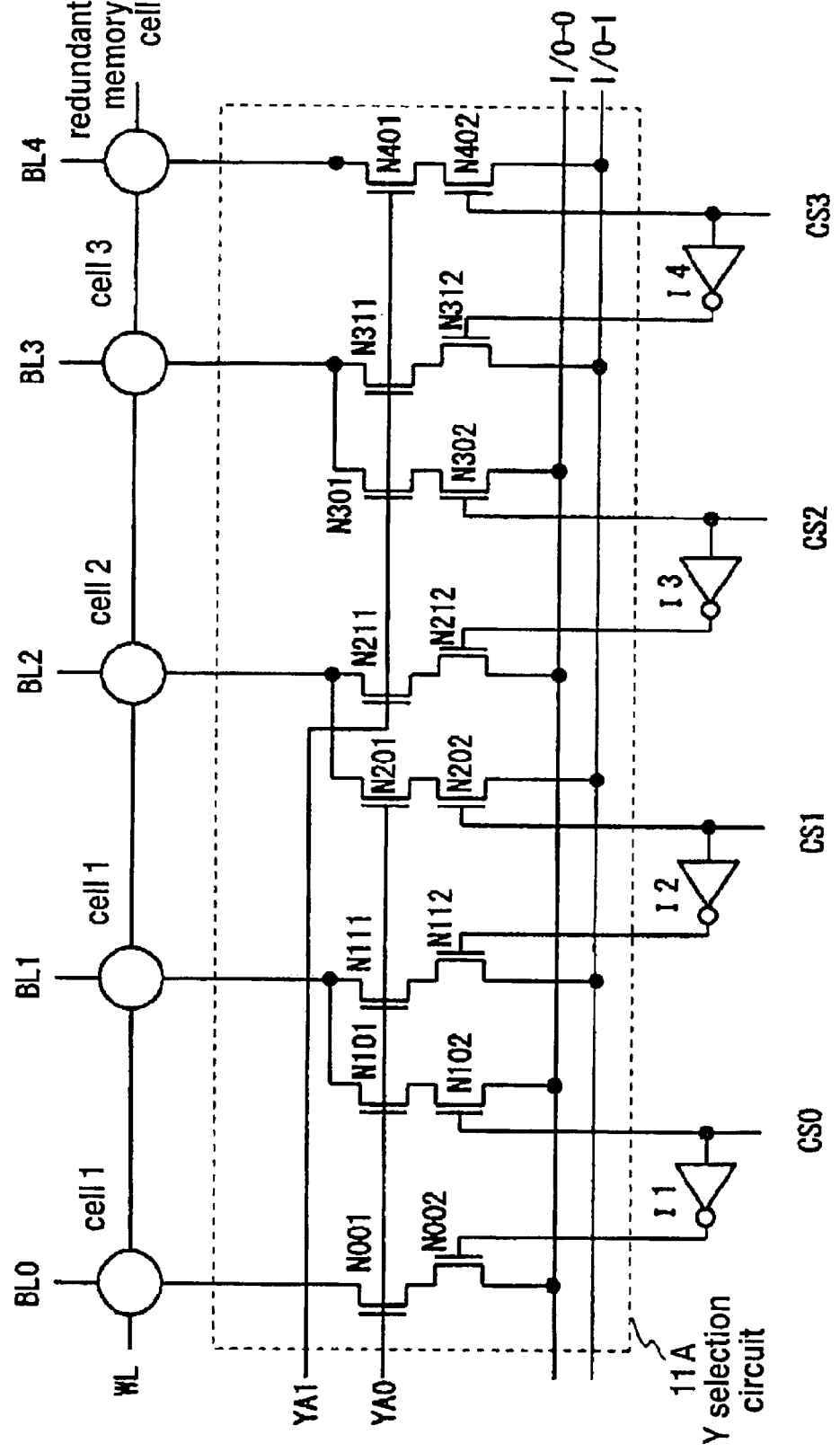
FIG. 6 is a circuit diagram illustrating a Y selection circuit in the second embodiment of the semiconductor memory device.

Referring to FIG. 6, there is shown a circuit diagram of the Y selection circuit 11A in the second embodiment. As seen from FIG. 6, a plurality of bit lines are simultaneously connected to a plurality of I/O lines in accordance with the Y selection signal. For only simplification of description, in FIG. 6 the sense amplifiers are omitted and the bit lines and the I/O lines are depicted as a single line in place of a pair of complementary lines. In addition, in FIG. 6, elements corresponding to those shown in FIG. 2 are given the same reference numbers.

The bit line BL0 connected to the sense amplifier SA0 is connected to the I/O line I/O-0 through a Y switch N001 and a switch N002 which are connected in series and which are formed of an nMOS transistor. The Y selection signal YA0 is connected to a gate of the Y switch N001, and a control signal CS0 is connected through an inverter I1 to a gate of the Y switch N002.

The bit line BL1 connected to the sense amplifier SA1 is connected to the I/O line I/O-0 through a Y switch N101 and a switch N102 which are connected in series and which are formed of an nMOS transistor, and also connected to the I/O line I/O-0 through a Y switch N111 and a switch N1 12 which are connected in series and which are formed of an nMOS transistor. The Y selection signal YA0 is connected to a gate of the Y switches N101 and N111, and the control signal CS0 is connected directly to a gate of the Y switch N102. A control signal CS1 is connected through an inverter I2 to a gate of the Y switch N112.

The bit line BL2 connected to the sense amplifier SA2 is connected to the I/O line I/O-0 through a Y switch N201 and a switch N202 which are connected in series and which are formed of an nMOS transistor, and also connected to the I/O line I/O-0 through a Y switch N211 and a switch N212 which are connected in series and which are formed of an nMOS transistor. The Y selection signal YA0 is connected to a gate of the Y switch N201, and the control signal CS1 is connected directly to a gate of the Y switch N202. The Y selection signal YA1 is connected to a gate of the Y switch N211, and a control signal CS2 is connected through an inverter I3 to a gate of the Y switch N212.

The bit line BL3 connected to the sense amplifier SA3 is connected to the I/O line I/O-0 through a Y switch N301 and a switch N302 which are connected in series and which are formed of an nMOS transistor, and also connected to the I/O line I/O-0 through a Y switch N311 and a switch N312 which are connected in series and which are formed of an nMOS transistor. The Y selection signal YA1 is connected to a gate of the Y switches N301 and N311, and the control signal CS2 is connected directly to a gate of the Y switch N302. A control signal CS3 is connected through an inverter I4 to a gate of the Y switch N312.

The bit line BL4 connected to the sense amplifier SA4 is connected to the I/O line I/O-0 through a Y switch N401 and a switch N402 which are connected in series and which are formed of an nMOS transistor. The Y selection signal YA0 is connected to a gate of the Y switch N401, and the control signal CS3 is connected directly to a gate of the Y switch N402.

When the control signals CS0 to CS3 are at "L", "L", "L" and "L", respectively, if the Y selection signal YA0 is at "H", the columns of the bit lines BL0 and BL1 are connected to the I/O lines I/O-0 and I/O-1, respectively, and if the Y selection signal YA1 is at "H", the columns of the bit lines BL2 and BL3 are connected to the I/O lines I/O-0 and I/O-1, respectively.

For example, if the cell 2 is defective, the control signals CS0 to CS3 are brought to "L", "L", "H" and "H", respectively. In this condition, if the Y selection signal YA1 is at "H", the columns of the bit line BL2 is not connected to the I/O line I/O-0, and the column of the bit line BL3 and the redundant column of the bit line BL4 are connected to the I/O lines I/O-0 and I/O-1, respectively.

In this arrangement, in the memory having a plurality of input/output terminals, it is possible to limit the number of sub-arrays which can simultaneously operate, to only one, so that a low power consumption is realized.

Figure 7:
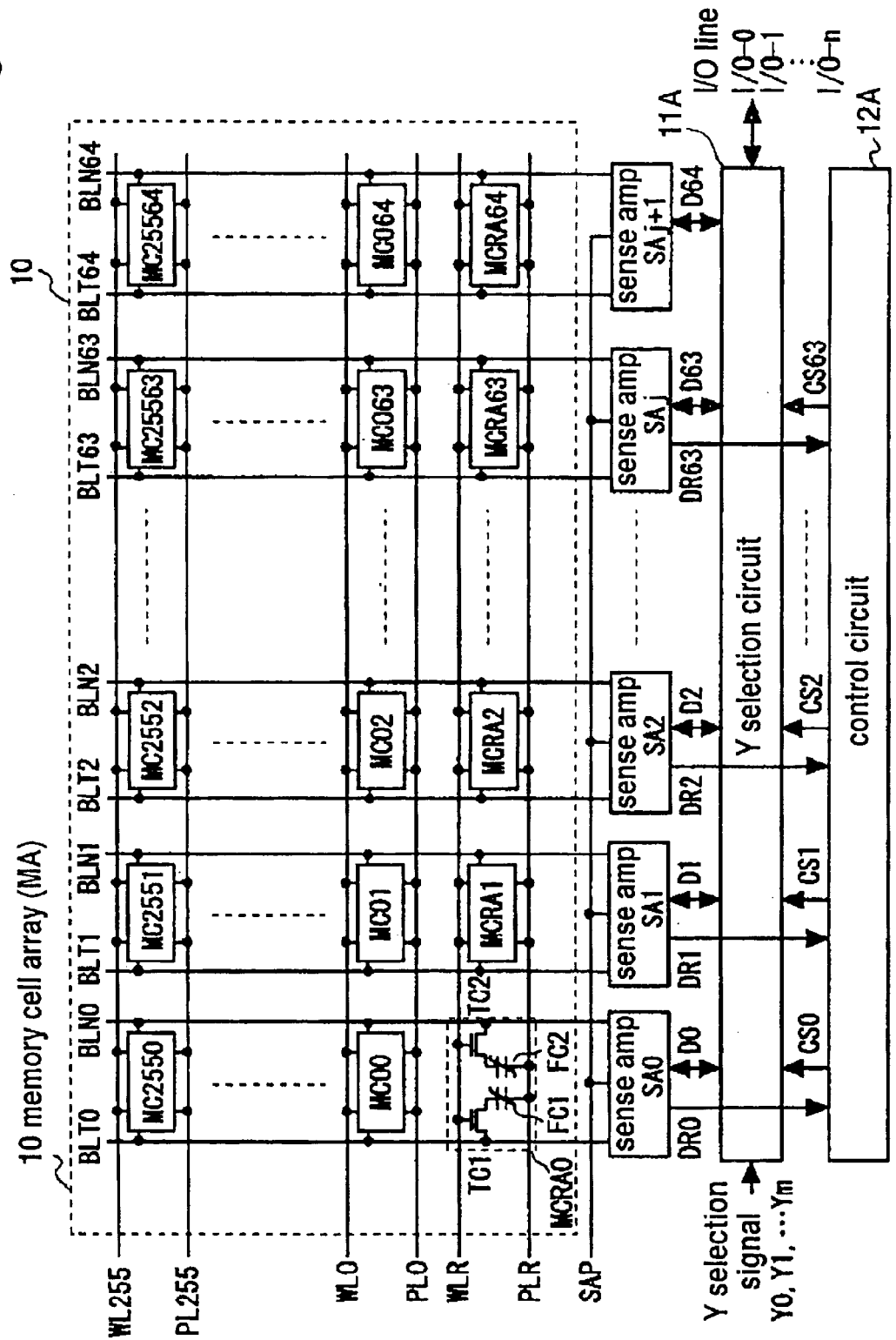
FIG. 7 is a block diagram of a third embodiment of the semiconductor memory device in accordance with the present invention.

Now a third embodiment of the semiconductor memory in accordance with the present invention will be described. FIG. 7 is a block diagram of the third embodiment of the semiconductor memory in accordance with the present invention. In FIG. 7, elements corresponding to those shown in FIGS. 1 and 5 are given the same reference numbers, and explanation will be omitted. In the third embodiment, the memory cell array 10 has the same construction of those included in the first and second embodiments, and the Y selection circuit 11A has the same construction of that included in the second embodiment. In addition, the defective cell substitution operation is the same as that in the first embodiment. However, a control circuit 12A has a construction different from that of the control circuit 12 in the first and second embodiments. Incidentally, in the memory cell array (MA) 10, memory cells $MC0_0$ to $MC255_{63}$ correspond to the memory cells $MC_{00}$ to $MC_{ij}$, respectively, and redundant memory cells $MC0_{64}$ to $MC255_{64}$ correspond to the redundant memory cells $MC_{0j+1}$ to $MC_{ij+1}$, respectively. Substitution information storing memory cells MCRA0 to MCRA64 correspond to the substitution information storing memory cells MCRA0 to $MCRA_{j+1}$, respectively. Word lines WL0 to WL255 correspond to the word lines WL0 to WLi, respectively, and plate lines PL0 to PL255 correspond to the plate lines PL0 to PLi, respectively.

Figure 8:
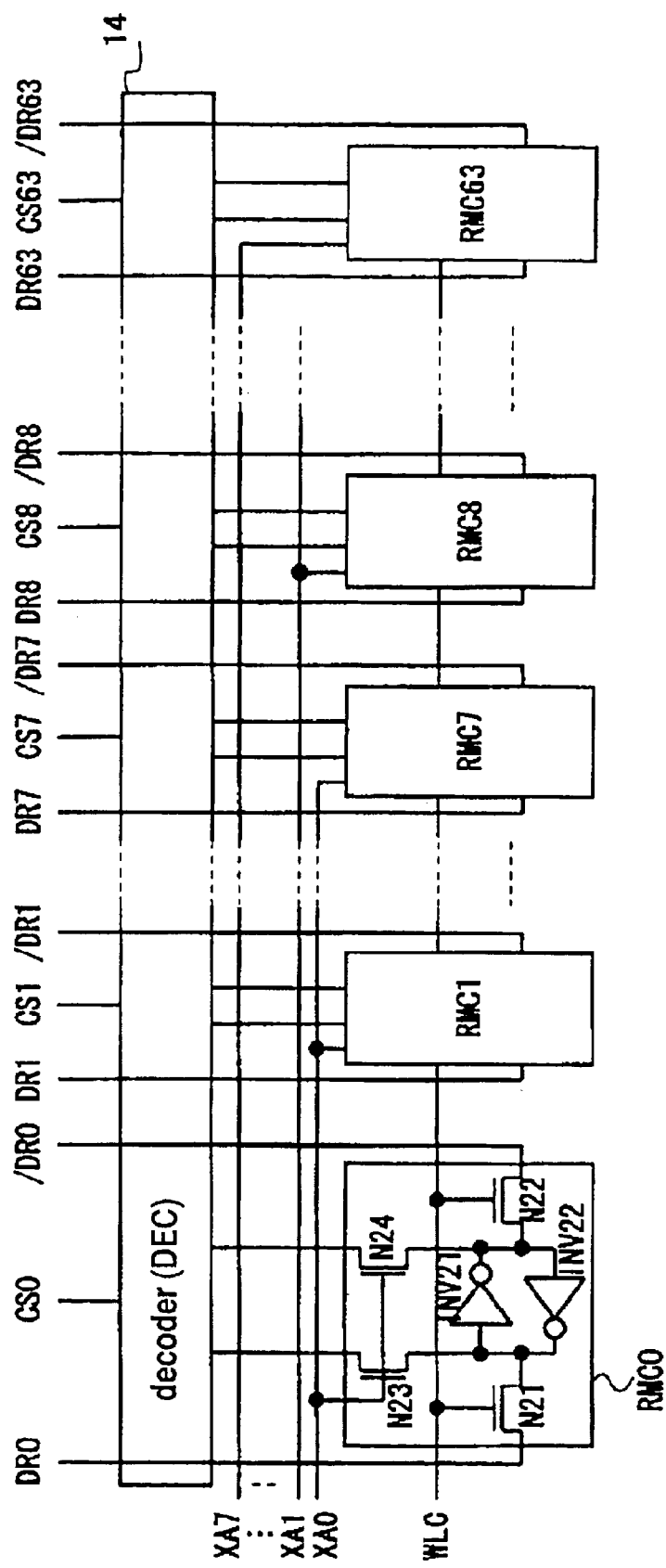
FIG. 8 is a circuit diagram illustrating a control circuit in the third embodiment of the semiconductor memory device.

Referring to FIG. 8, there is shown a circuit diagram of the control circuit 12A in the third embodiment. As shown in FIG. 8, the control circuit 12A includes volatile memory cells RMC0 to RMC63 (RMC0 to RMCj) for storing the substitution information, and a decoder (DEC) 14. The memory cell RMC0 includes two inverters INV21 and INV22 each having an input connected to an output of the other inverter so as to form a latch circuit, and transfer gate nMOS transistors N21 and N22 having a gate connected to a write control line WLC. One end of the transfer gate nMOS transistors N21 and N22 are respectively connected to a pair of complementary output lines DR0 and /DR0 of the sense amplifier connected to the substitution information storing memory cell MCRA0. The other end of the transfer gate nMOS transistors N21 and N22 are respectively connected to two connection nodes of the inverters INV21 and INV22 connected to each other in opposite direction.

The memory cell RMC0 also includes nMOS transistors N23 and N24, which are connected between the decoder 14 and the two connection nodes of the inverters INV21 and INV22, respectively. A decode signal XA0 of a X address is supplied to a gate of these nMOS transistors N23 and N24. The other memory cells RMCj (j=0 to 63) have a similar construction, but receive a pair of outputs DRj and /DRj of the associated sense amplifier and a decode signal XAk (k=0 to 7). The decoder 14 outputs the control signals CS0 to CS63 to the Y selection circuit 11A.

In the first and second embodiments, the substitution information was the control signals CS0 to CSj themselves for the Y selection circuits 11 and 11A. In this third embodiment, the substitution information is an address of the column including the defective memory cell.

In this third embodiment, the memory cell array includes 257 word lines and 65 bit line pairs (BLT and BLN). However, the memory cell array can include the word lines of any other number and the bit line pairs of any other number.

In FIG. 7, it is sufficient if 6 bits are reserved in order to designate the address of 64 columns other than the redundant column. Therefore, for the substitution information it is sufficient if an area of 7 bits is reserved for the 6-bit address and one bit indicative of substitution or nonsubstitution.

In the third embodiment, since the area used for storing the substitution information includes 64 bits, 8 items of substitution information can be recorded.

Figure 9:
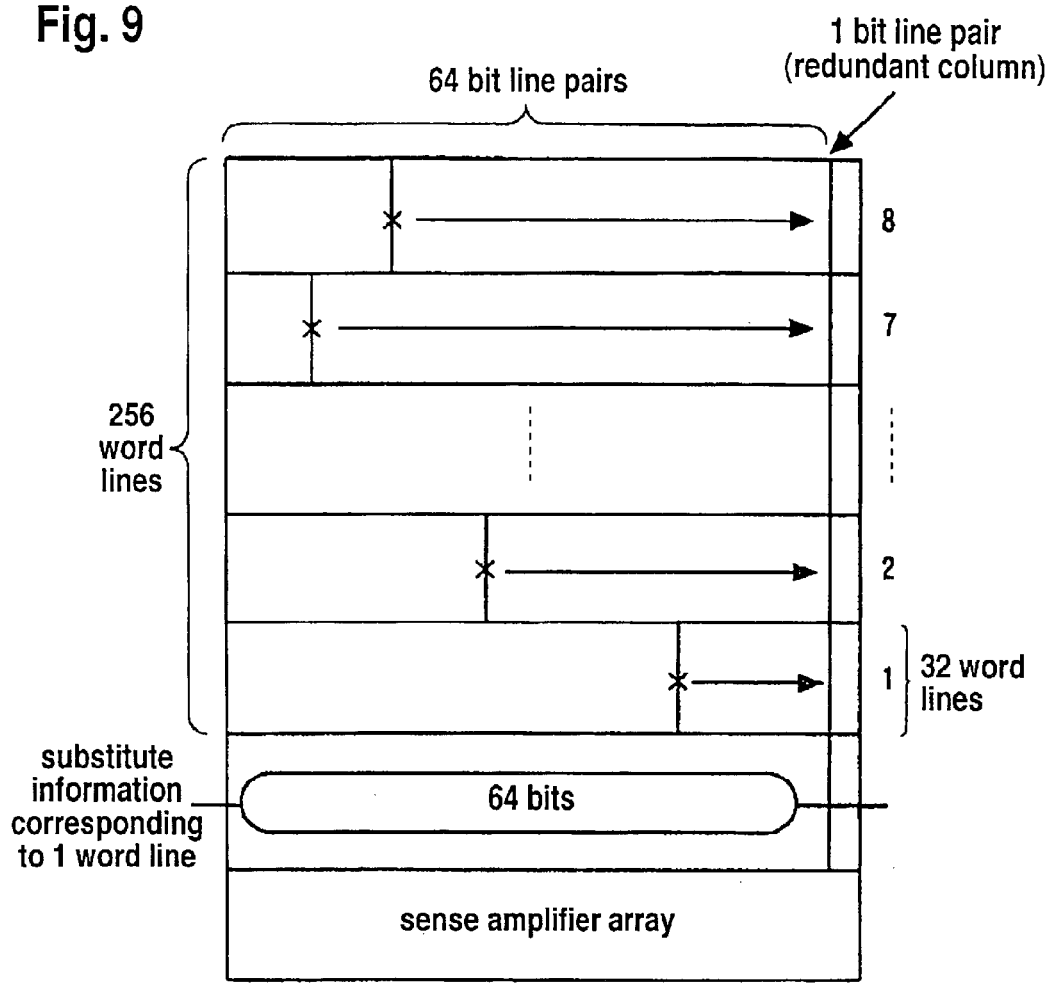
FIG. 9 illustrates the third embodiment of the semiconductor memory device.

Therefore, as shown in FIG. 9, 256 word lines divided into 8 groups each consisting of 32 word lines, and it is configured that one substitution information is allocated to one group of word lines. Therefore, it is possible to change a substitution column for each 32 word lines, so that even if the defective memory cells are included in different columns, respectively, it is possible to relieve the memory.

In the control circuit shown in FIG. 8, of the 64 bits of the volatile memory cells, the substitution information of 8 bits corresponding to the word line area to be accessed is selected.

In order to select the substitution information, the X address for selecting the word line is utilized. The decode signals XA0 to XA7 are signals obtained by decoding the address signal of three bits, indicative of 8 word line areas, into 8 different signals, and by obtaining a logical AND of the respective 8 different signals and a timing signal. On the other hand, the decoder 14 generates the control signals CS0 to CS63 on the basis of the substitution information of 8 bits.

Similarly to the first and second embodiments, the (0)th control signal CS0 to the control signal counted from the (0)th control signal by the number obtained by subtracting "1" from the number of the defective column, are brought to the low level "L", and the other control signals are brought to the high level "H". In no substitution, all the control signals are maintained at the low level "L".

Figure 10:
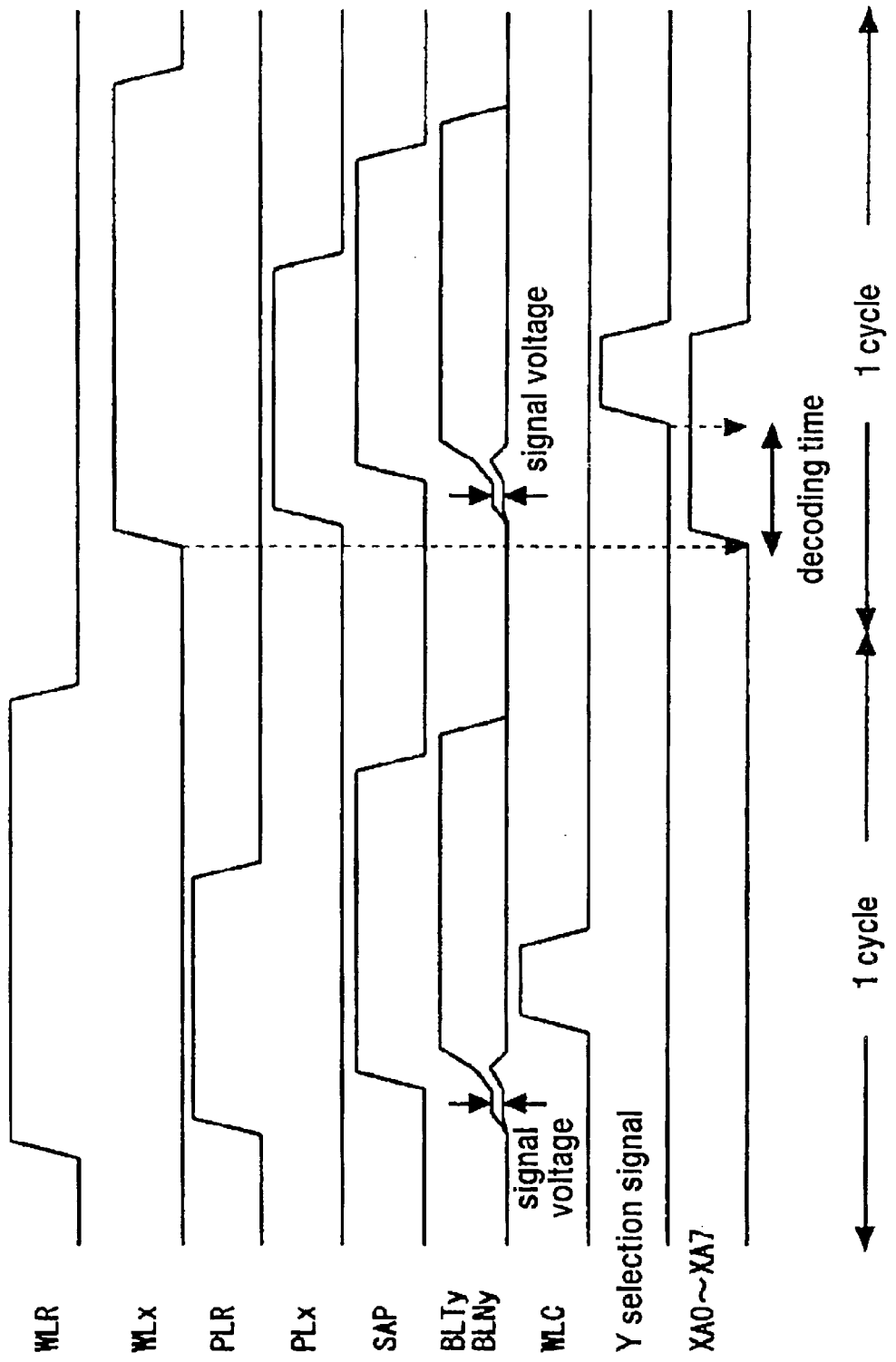
FIG. 10 is a timing chart illustrating the operation of the third embodiment of the semiconductor memory device.

Now, an operation of the embodiment shown in FIG. 7 will be described with reference to FIG. 10, which is a timing chart for illustrating the operation of the circuit shown in FIG. 7. FIG. 10 shows respective waveforms of the word line WLR connected to the substitution information storing memory cells shown in FIG. 7, the word line WLx (x=0 to 255) connected to the main memory cells, the plate line PLR connected to the substitution information storing memory cells, the plate line PLx (x=0 to 255) connected to the main memory cells, the sense amplifier activation signal SAP, a (y)th pair of bit lines BLTy and BLNy (y=0 to 64), the write control line WLC (FIG. 8), and the Y selection signal, the decode signals XA0 to XA7 (FIG. 8).

The third embodiment is similar to the first and second embodiments in the reading of the substitution information storing memory cells and in that in a second and succeeding cycles, the main memory cells are accessed and the substitution information storing memory cells are not accessed.

The selection of the substitution information read out from the substitution information storing memory cells RMC0 to RMC63 become possible when the X address becomes established. Therefore, the decoder DEC starts to operate at the moment the word lines WLx are activated.

On the other hand, if the Y selection signal is brought to the high level "H", the data read out from the memory cell is outputted through the I/O line to the external, or the write data supplied from the external is written into the memory cell through the I/O line, and when the Y selection signal is returned to the low level "L", the control circuit 12A terminates the operation.

Therefore, the time after the word line is brought to the high level "H" until the Y selection signal is brought to the high level "H", is utilized as a decoding time for the control signal.

In this third embodiment, accordingly, since it is possible to set one substitution column for each of the groups of word lines, it is possible to relieve the memory even if a plurality of defective memory cells exist in different columns, respectively. Since it is at least possible to relieve one defective memory cell for each one word line group, it is possible to relieve eight defective memory cells in total.

Furthermore, the translation of the substitution column address into the substitution control signals can be carried out by utilizing the time until the Y selection circuit starts the operation, since the control circuit 12A can starts the operation at the same time as the operation of the word line.

In addition, the operation of the Y selection circuit after the control signals are generated is the same as those in the first and second embodiments. In this third embodiment, therefore, there occurs no overhead in the access time attributable to the column substitution operation.

In this third embodiment, the memory cell array includes the 64 columns. It would be a matter of course that there is no limitation in connection with the number of columns. For example, in a memory cell array including 128 column, 8 bits are necessary for the substitution information. In this case, since 128 bits are available as substitution information storing memory cells, the word lines can be divided into 16 groups at maximum, and therefore, it is possible to relieve at least 16 defective memory cells in total.

Figure 11:
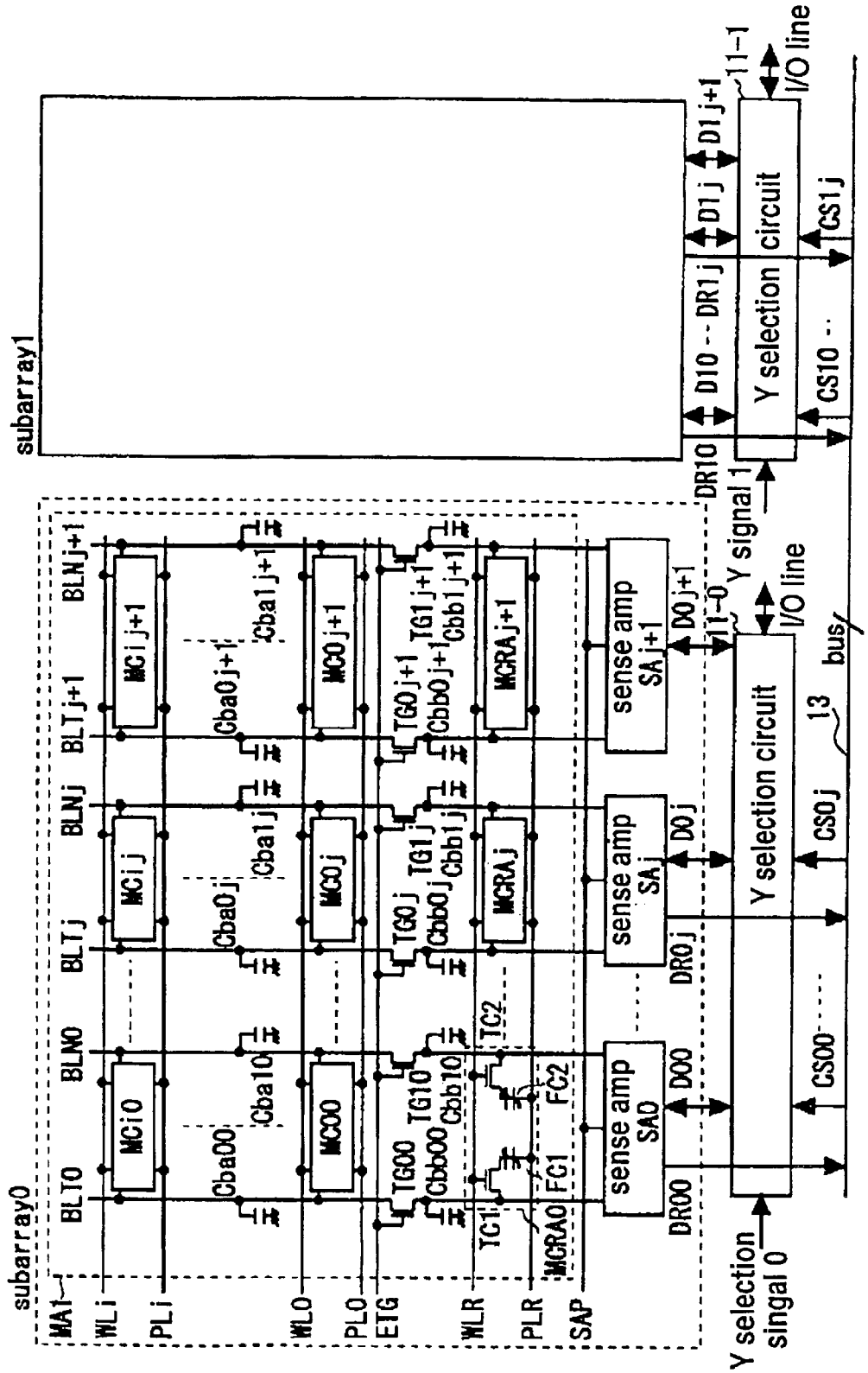
FIG. 11 is a block diagram of a fourth embodiment of the semiconductor memory device in accordance with the present invention.

Now, a fourth embodiment of the semiconductor memory in accordance with the present invention will be described. Referring to FIG. 11, there is shown a block diagram of the fourth embodiment of the semiconductor memory in accordance with the present invention.

The shown fourth embodiment includes two sub-arrays "subarray0" and "subarray1". The "subarray0" includes a memory cell array MA1 and a plurality of sense amplifiers SA0 to $SA_{j+1}$. The memory cell array MA1 includes a number of memory cells $MC_{00}$ to $MC_{ij}$, one column of redundant memory cells $MC_{0j+1}$ to $MC_{ij+1}$, and one word line of substitution information storing memory cells MCR0 to $MCRA_{j+1}$.

Furthermore, transfer gates TG00 and TG10 to $TG0_{j+1}$ and $TG1_{j+1}$ are inserted between the substitution information storing memory cells and the memory cells $MC_{00}$ to $MC_{ij}$ and the redundant memory cells $MC_{0j+1}$ to $MC_{ij+1}$, and controlled by a signal ETG to be able to selectively separate the memory cells $MC_{00}$ to $MC_{ij}$ and the redundant memory cells $MC_{0j+1}$ to $MC_{ij+1}$, from the sense amplifiers SA0 to $SA_{j+1}$.

Each bit line includes a parasite capacitance depending upon the number of the memory cells connected to the bit line concerned. In FIG. 11, parasite capacitance Cbb00 and Cbb10 to $Cbb0_{j+1}$ and $Cbb1_{j+1}$ are far smaller than parasite capacitance Cba00 and Cba10 to $Cba0_{j+1}$ and $Cba1_{j+1}$.

In addition, Y selection circuits 11-0 and 11-1 can be the same as the Y selection circuit used in the first or second embodiment. The "subarray1" has the same construction as that of the "subarray1".

As seen from FIG. 11, this fourth embodiment includes no control circuit for controlling the column substitution. The control signals $CS_{00}$ to $CS_{0j}$ and $CS_{10}$ to $CS_{1j}$ for the Y selection circuits 11-0 and 11-1 are supplied from an adjacent sub-array.

Namely, two sub-arrays are paired or mated so that the substitution information storing memory cells of each sub-array store the substitution information for the other or adjacent sub-array. In order to supply the control signals to the adjacent sub-array, a local bus 13 having the width of (j+1) bits is connected between a pair of adjacent sub-arrays so as to be used only between the pair of adjacent sub-arrays.

Now, an operation of the embodiment shown in FIG. 11 will be described with reference to FIG. 12, which illustrates the operation in the case that the memory access is carried out for the sub-array "subarray0" and therefore the column substitution information is supplied from the sub-array "subarray1".

When a (x)th word line WLx (x=0 to "i") in the sub-array "subarray0" is accessed, the word line WLR connected to the substitution information storing memory cells in the sub-array "subarray1" is simultaneously brought to the high level "H".

The transfer gate control signal ETG is brought to the high level "H" in the sub-array "subarray0" but to the low level "L" in the sub-array "subarray1". In addition, in the sub-array "subarray0", the plate line PLx and the sense amplifier activation signal SAP are brought to the high level "H" in the named order with a delay, so that a reading is carried out. In the sub-array "subarray1", on the other hand, the plate line PLR is maintained at the low level "L" and the sense amplifier activation signal SAP is brought to the high level "H".

Figure 13:
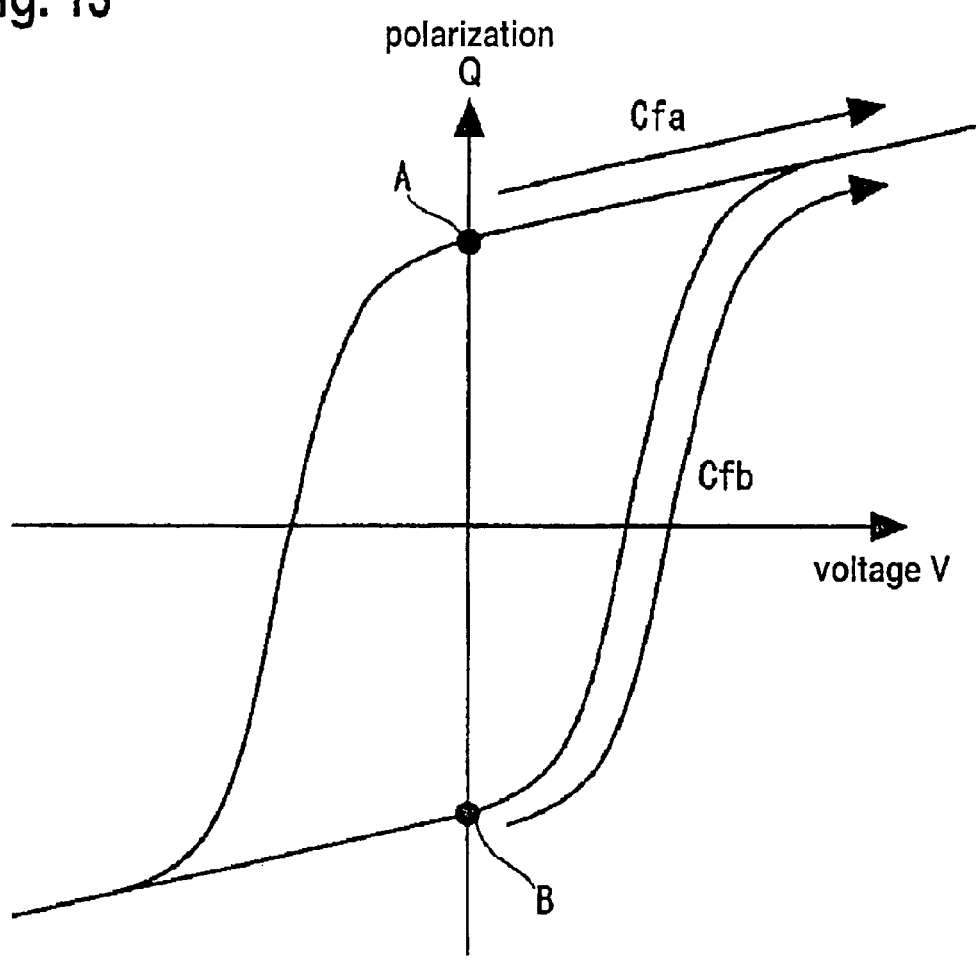
FIG. 13 is a graph for illustrating the fourth embodiment of the semiconductor memory device.

Here, the two-transistor, two-capacitor type memory cell (as designated by MCRA0 in FIG. 11) stores one bit of information by the fact that one ferroelectric capacitor takes a condition designated by the point "A" in FIG. 13 and the other ferroelectric capacitor takes a condition designated by the point "B" in FIG. 13.

If the sense amplifier activation signal SAP is brought to the high level "H" so as to apply a voltage to the ferroelectric capacitors of the memory cell, the ferroelectric capacitor taking the condition "A" is small in capacitance (Cfa) but the ferroelectric capacitor taking the condition "B" is large in capacitance (Cfb).

Figure 14:
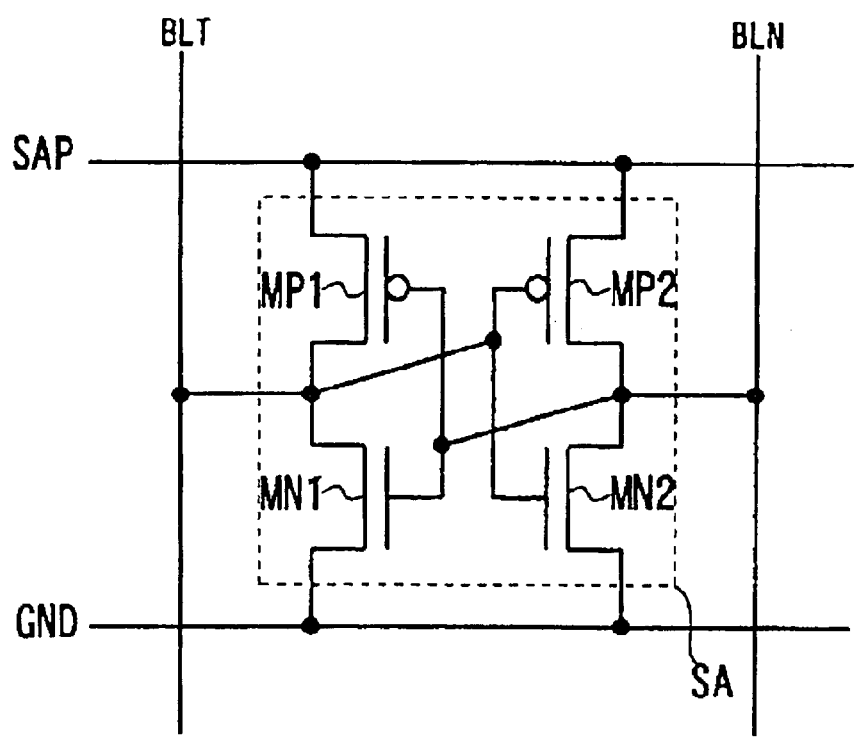
FIG. 14 is a circuit diagram for illustrating the fourth embodiment of the semiconductor memory device.

Here, the sense amplifier is a latch type sense amplifier having a circuit construction as shown in FIG. 14. This latch type sense amplifier SA includes two CMOS inverters connected between a line of the sense amplifier activation signal SAP and a ground line GND, an input of each CMOS inverter is connected to an output of the other CMOS inverter. One CMOS inverter is constituted of a pMOS transistor MP1 and a nMOS transistor MN1 connected in series and has an input and an output connected to the bit lines BLN and BLT, respectively. The other CMOS inverter is constituted of a pMOS transistor MP2 and a nMOS transistor MN2 connected in series and has an input and an output connected to the bit lines BLT and BLN, respectively. The two pMOS transistors MP1 and MP2 have the same size, and the two nMOS transistors MN1 and MN2 have the same size. In addition, the bit lines BLT and BLN take the ground potential (GND) in an initial condition. Therefore, equal currents flow through the two pMOS transistors MP1 and MP2, respectively. However, since the capacitance of the ferroelectric capacitors connected to the bit lines BLT and BLN, respectively, are different, the voltage of the ferroelectric capacitor having a small capacitance quickly elevates in comparison with the ferroelectric capacitor having a large capacitance.

Specifically, the capacitance charged by the pMOS transistors in the sense amplifier is "Cfa+Cbb" in one of the pair of bit lines, and "Cfb+Cbb" in the other of the pair of bit lines. Therefore, it can be said from the relation of V=It/C that at some time, the potential of the bit line having a smaller capacitance is higher than that of the bit line having a larger capacitance, so that a voltage difference (signal voltage) occurs between the pair of bit lines.

The voltage on the bit line increases, and when the voltage on the bit line exceeds a threshold Vt of the nMOS transistor, the nMOS transistor starts to operate, with the result that a signal voltage is amplified and the reading is completed. In this reading method, it is preferable that the parasite capacitance of the bit line is rather small. Since the bit line capacitance is very small in the sub-array "subarray1", the operation speed of the sense amplifier is very high in comparison with the sense amplifier in the sub-array "subarray0".

Figure 12:
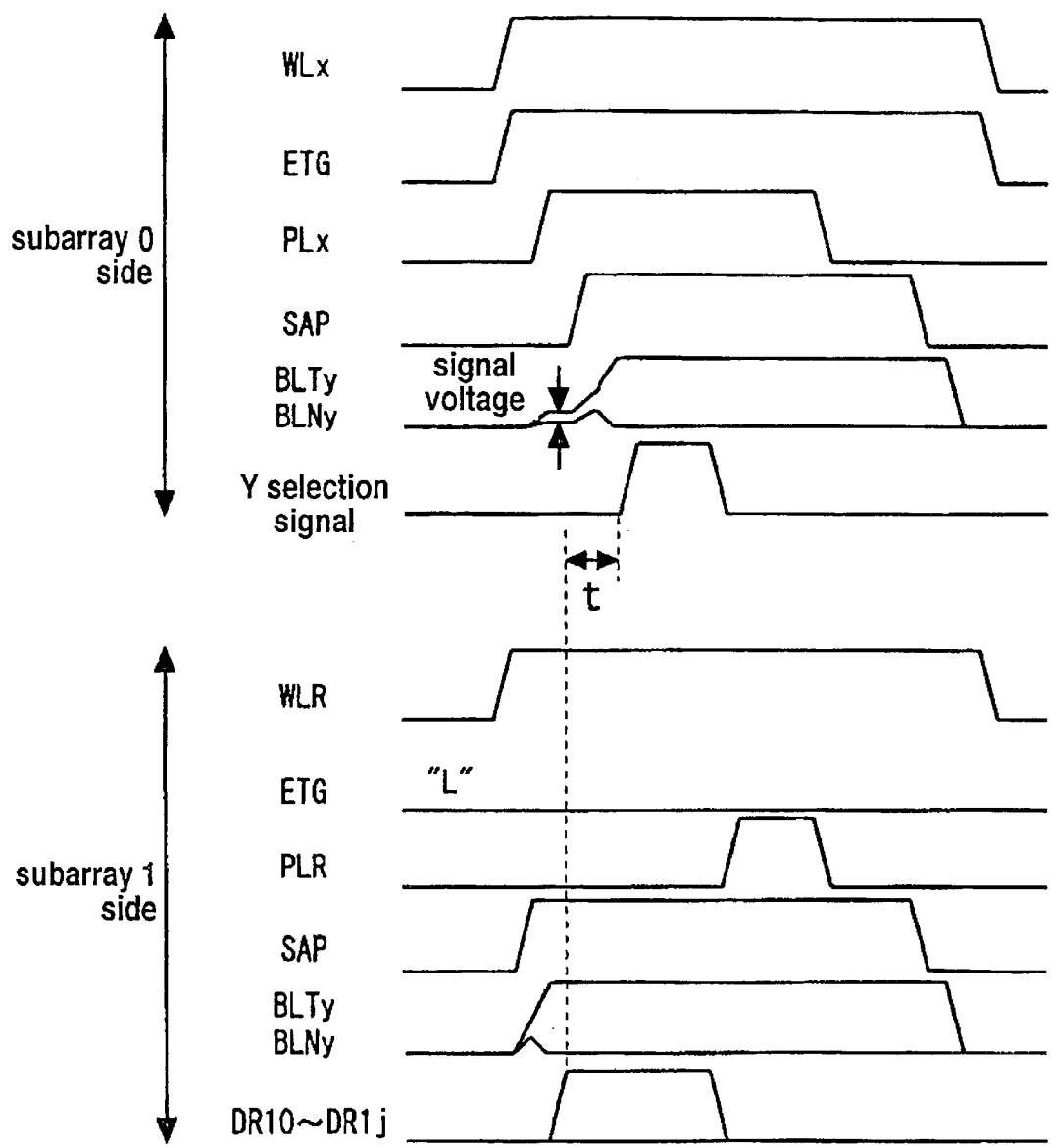
FIG. 12 is a timing chart illustrating the operation of the fourth embodiment of the semiconductor memory device.

Thus, in the reading operation of the sub-array "subarray1", since the plate line is not driven and since the operation speed of the sense amplifier is very high, the reading of the substitution information cells is completed earlier than the reading of the main memory cells by a time "t" as shown in FIG. 12.

The substitution information $DR_{10}$ to $DR_{ij}$ read out from the sub-array "subarray1", is supplied to the Y selection circuit 11-0 in the sub-array "subarray0" as the control signals $CS_{00}$ to $CS_{0j}$. The Y selection circuit 11-0 in the sub-array "subarray0" replaces the defective column by the non-defective column in accordance with the received control signals $CS_{00}$ to $CS_{0j}$.

It would be seen from the above description that when the memory cell in the sub-array "subarray1" is read out, the substitution information is supplied from the sub-array "subarray0".

As seen from the above, in this fourth embodiment, since the volatile memory cells for temporarily holding the contents of the substitution information storing memory cells are no longer necessary, it is possible to suppress an increase in the chip area attributable to the installation of the defective memory cell substitution circuit.

In addition, it is not necessary to read the substitution information when the power supply is turned on for the memory chip.

Furthermore, in the first to third embodiments, the operation for reading the substitution information has to be realized by a dedicated circuit incorporated in a ferroelectric memory device, for detecting the turning-on of the power supply to cause the reading operation to be executed, or alternatively by a software manner combined with a CPU. However, in this fourth embodiment, since none of these means is required, the system is simplified.

Moreover, in the reading operation of the substitution information storing memory cells, since the bit line capacitance is negligibly small as compared with the capacitance of the ferroelectric capacitor, it is possible to minimize the influence of an unbalance of the capacitance between the pair of bit lines and a coupling noise that the bit line of a long length receives.

In other words, even if the characteristics of the substitution information storing memory cells is deteriorated, it is possible to satisfactorily read out the information from the substitution information storing memory cells, and the reliability does not lower even if the substitution information storing memory cells are read out for every cycle.

Figure 15:
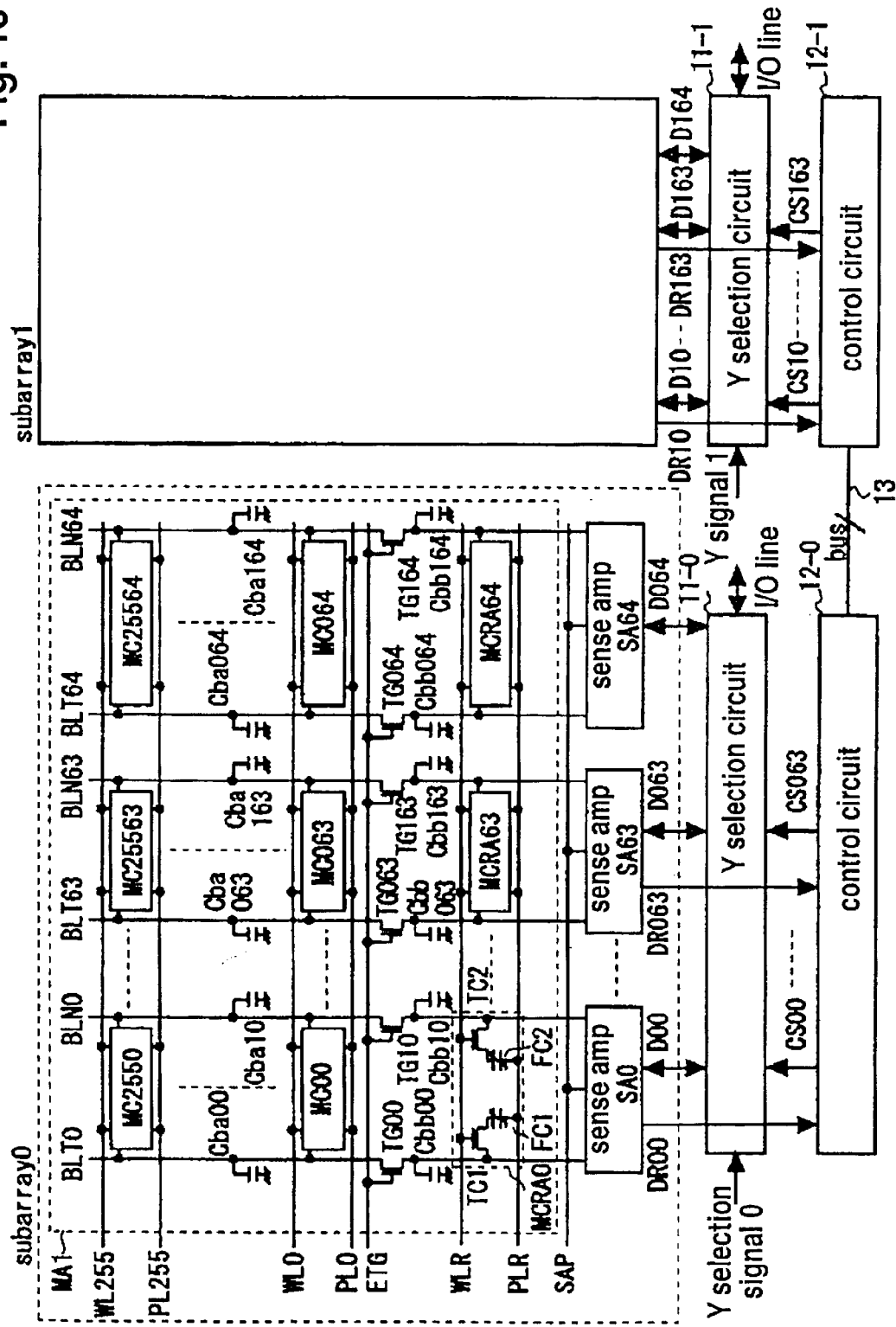
FIG. 15 is a block diagram of a fifth embodiment of the semiconductor memory device in accordance with the present invention.

Now, a fifth embodiment of the semiconductor memory device in accordance with the present invention will be described with reference to FIG. 15, which is a block diagram of the fifth embodiment of the semiconductor memory device. Incidentally, memory cells $MC0_0$ to $MC255_{63}$ correspond to the memory cells $MC_{00}$ to $MC_{ij}$, respectively, and redundant memory cells $MC0_{64}$ to $MC255_{64}$ correspond to the redundant memory cells $MC_{0j+1}$ to $MC_{ij+1}$, respectively. Substitution information storing memory cells MCRA0 to MCRA64 correspond to the substitution information storing memory cells MCRA0 to $MCRA_{j+1}$, respectively. Word lines WL0 to WL255 correspond to the word lines WL0 to WLi, respectively, and plate lines PL0 to PL255 correspond to the plate lines PL0 to PLi, respectively. Transfer gates TG00 and TG10 to TG064 and TG164 correspond to the transfer gates TG00 and TG10 to $TG0_{j+1}$ and $TG1_{j+1}$, respectively.

In this fifth embodiment, each sub-array of the memory cell array has 257 word lines and 65 bit line pairs, but can take any other arrangement. The location of the transfer gates is the same as the four embodiment.

The fifth embodiment is different from the fourth embodiment in that the fifth embodiment includes control circuits 12-0 and 12-1 associated with the sub-array "subarray0" and "subarray1", respectively.

Figure 16:
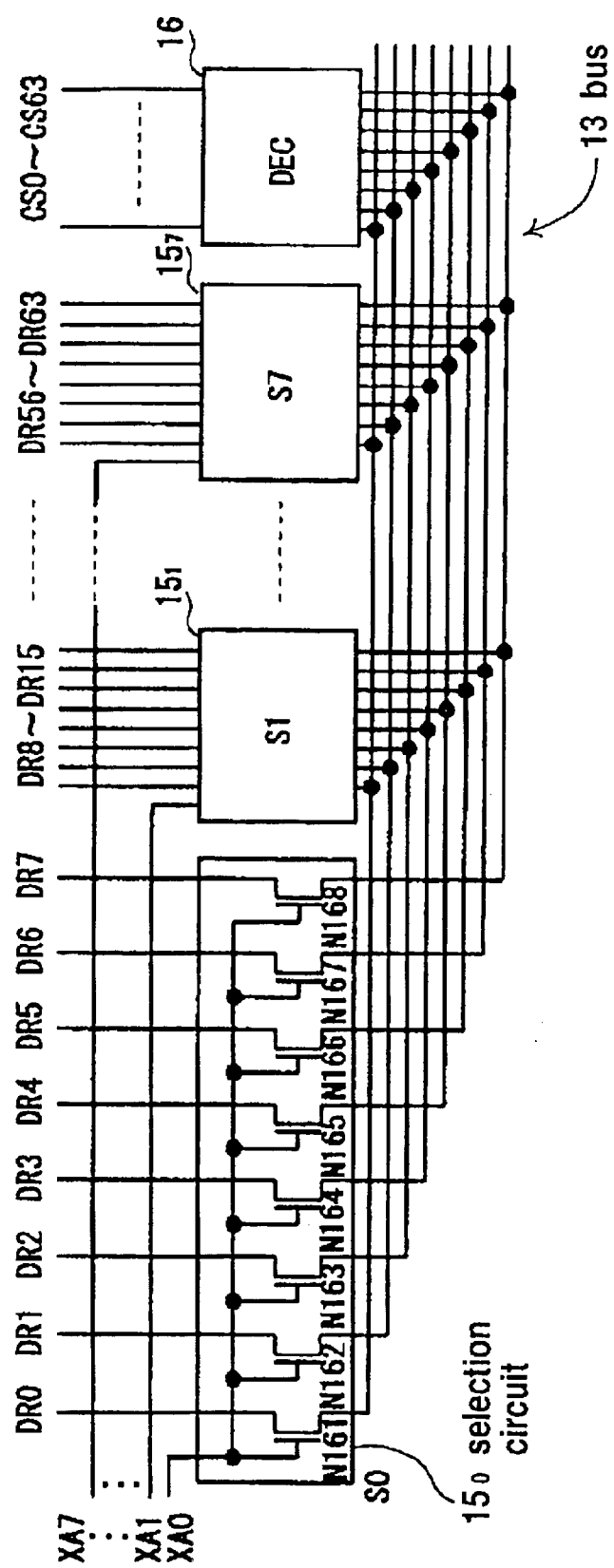
FIG. 16 is a circuit diagram illustrating a control circuit in the fifth embodiment of the semiconductor memory device.

As shown in FIG. 16, each of the control circuits 12-0 and 12-1 includes selection circuits (S0 to S7) $15_0$ to $15_7$, and a decoder (DEC) 16. The selection circuit (S0) $15_0$ includes 8 nMOS transistors N161 to N168 connected between the read-out data lines DR0 to DR7 of the substitution information storing memory cells and the lines of the bus 13, respectively. A gate of these nMOS transistors N161 to N168 is connected to a corresponding one XA0 of the decode signals XA0 to XA7 of the X address. The other selection circuits (S1 to S7) $15_1$ to $15_7$ have a similar construction, but receive different read-out data lines of the substitution information storing memory cells and are controlled by different decode signals XA1 to XA7 of the X address.

In this fifth embodiment, the substitution information is the address of the column including the defective memory cell, similarly to the third embodiment, and the word lines are divided into a plurality of groups, and one substitution information is allocated to one group of word lines, similarly to the third embodiment.

In addition, similarly to the fourth embodiment, two sub-arrays are paired or mated, so that the substitution information for each of the pair of sub-arrays is stored in the other sub-array. When the memory cell is read out, the substitution information is simultaneously read out.

The fifth embodiment is different from the fourth embodiment in that since the substitution information is the address of the defective column, the number of lines in the bus 13 can be reduced.

Figure 17:
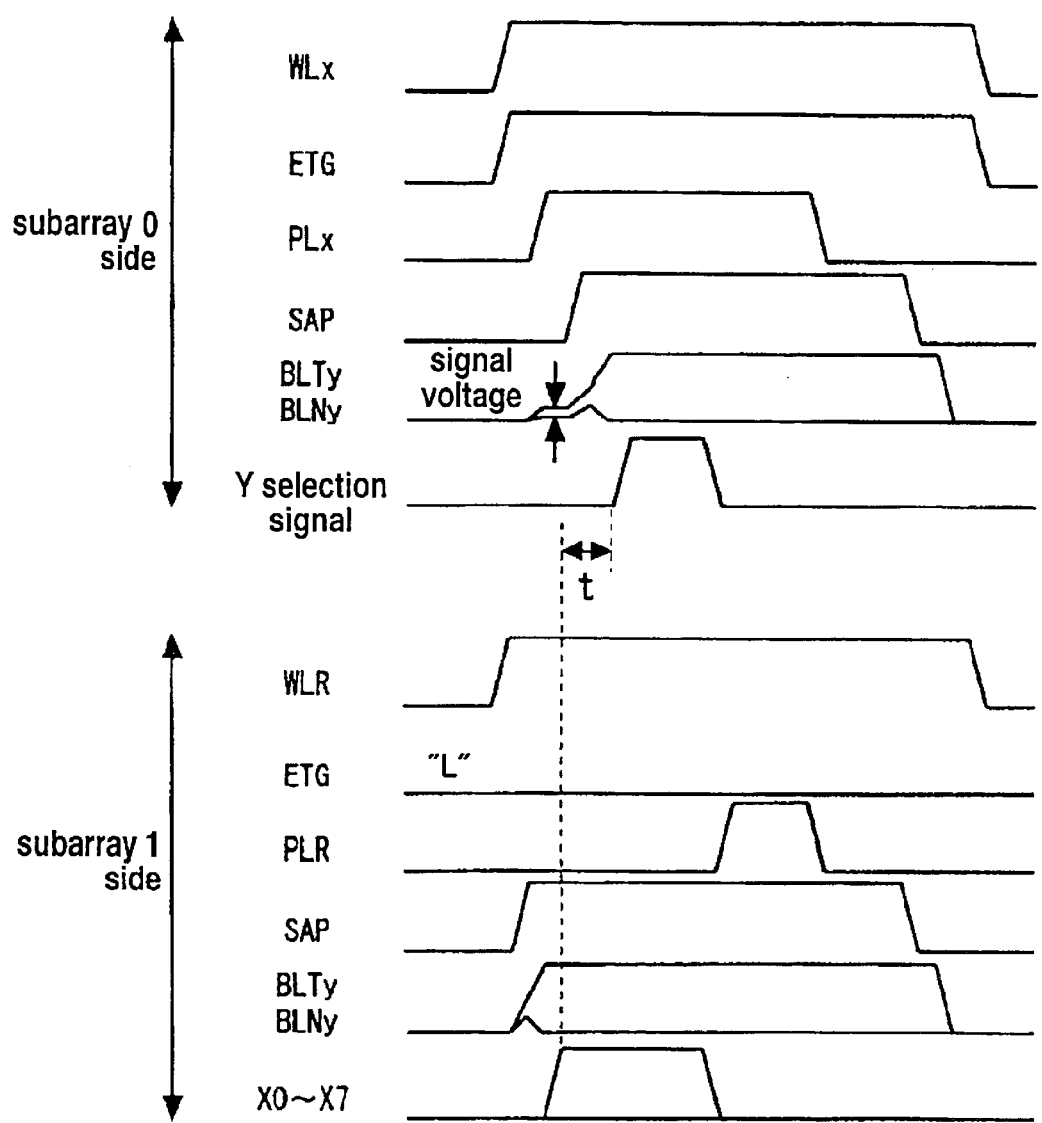
FIG. 17 is a timing chart illustrating the operation of the fifth embodiment of the semiconductor memory device.

Now, an operation of the fifth embodiment shown in FIG. 15 will be described with reference to FIG. 17, which is a timing chart illustrating the operation of the fifth embodiment of the semiconductor memory device.

The reading of the main memory cells and the reading of the substitution information storing memory cells are the same as those in the fourth embodiment. A different point is that, of the substitution address information of 64 bits, only 8 bits selected by the selection signals X0 to X7 are outputted to the bus 13.

The selection signals X0 to X7 are generated by utilizing the X address for selecting the word line, similarly to the third embodiment.

The substitution address outputted onto the bus 13 is translated into the control signals CS0 to CS63 by the decoder (DEC) 16 within the time "t", and the control signals CS0 to CS63 are outputted to the Y selection circuit.

The Y selection circuit 11-0 or 11-1 selects the column to be read out or written, in accordance with the control signal and the Y selection signal, and connects the selected column to the I/O line.

Accordingly, similarly to the fourth embodiment, in this fifth embodiment, since it is not necessary to read the substitution information when the power supply is turned on for the memory chip, the system is simplified.

In addition, since the volatile memory cells for temporarily holding the contents of the substitution information storing memory cells are no longer necessary, it is possible to minimize an increase in the chip area attributable to the installation of the defective memory cell substitution circuit. Since the number of lines included in the local bus can be reduced, the area for the local bus can be reduced.

Since the reading of the substitution information can be achieved at a speed higher than that of the reading of the main memory cells, this fifth embodiment has no overhead in the access time for translating the substitution column address into the control signals.

Figure 18:
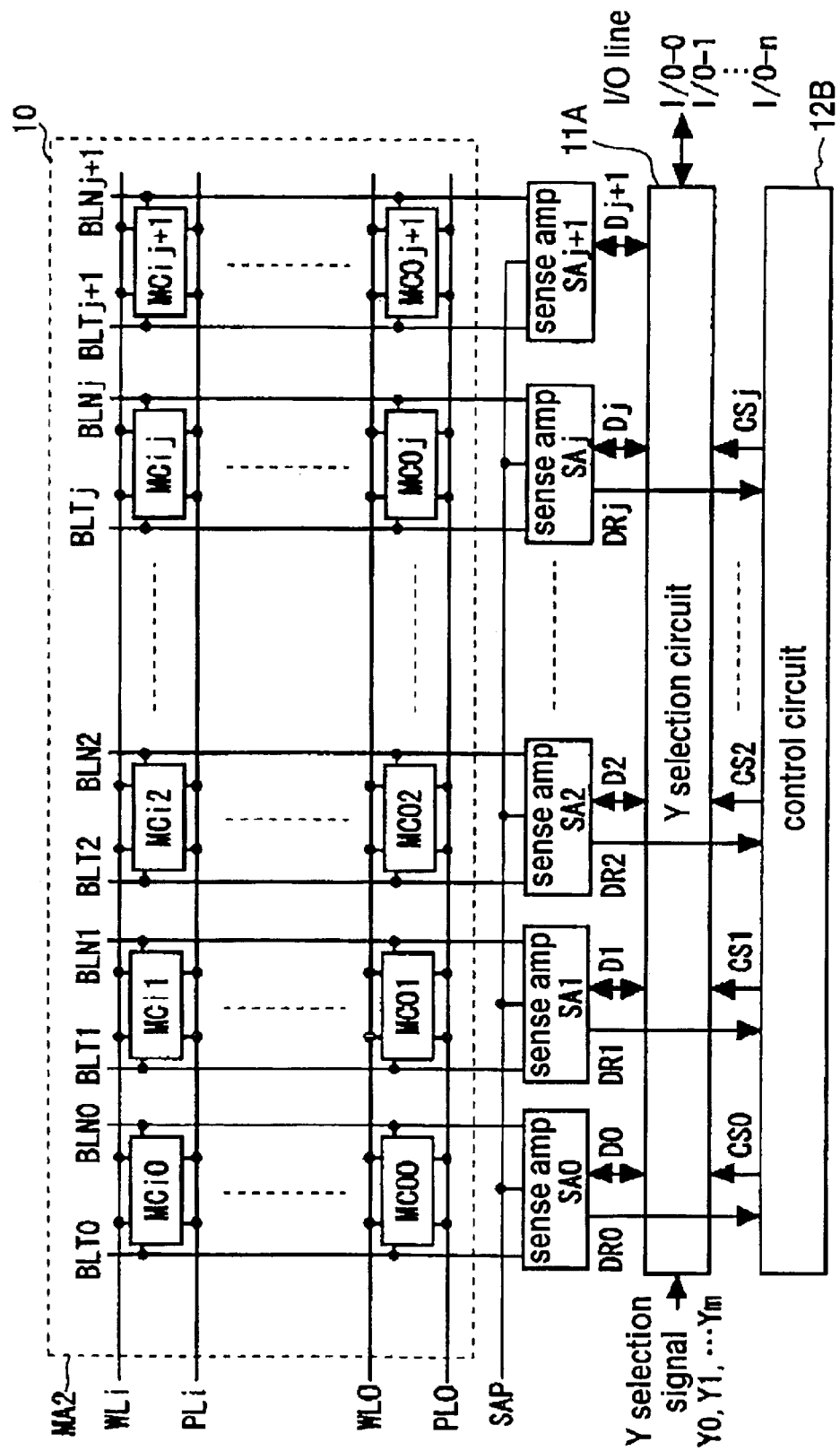
FIG. 18 is a block diagram of a sixth embodiment of the semiconductor memory device in accordance with the present invention.

Now, a sixth embodiment of the semiconductor memory device in accordance with the present invention will be described with reference to FIG. 8, which is a block diagram of the sixth embodiment of the semiconductor memory device. In FIG. 18, elements corresponding to those shown in FIG. 5 are given the same reference numbers, and explanation will be omitted for simplification of the description.

In this sixth embodiment, a memory cell array (MA2) 10 includes a number of memory cells $MC_{00}$ to $MC_{ij}$ arranged in the form of a matrix and one column of redundant memory cells $MC_{0j+1}$ to $MC_{ij+1}$, but does not include substitution information storing memory cells.

Each of sense amplifiers SA0 to $SA_{j+1}$ is connected to a corresponding pair of bit lines of a number of bit lines pairs BLT0 and BLN0 to $BLT_{j+1}$ and $BLN_{j+1}$. A Y selection circuit 11A is the same as the construction shown in FIG. 6.

Figure 19:
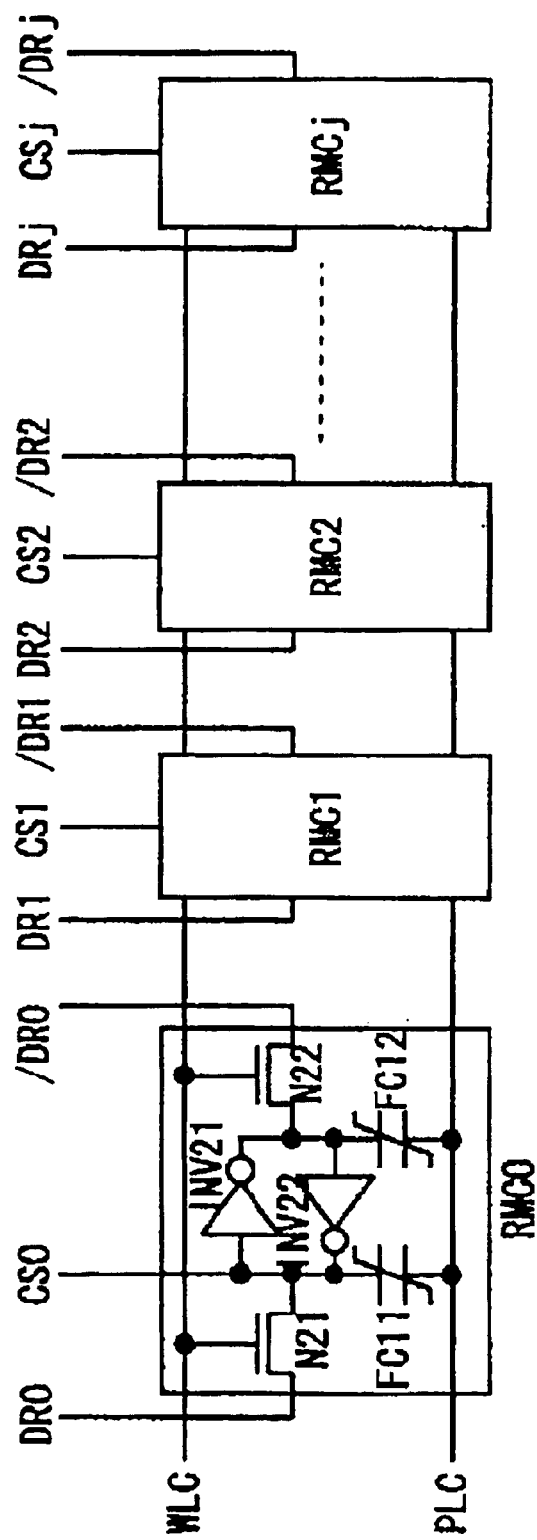
FIG. 19 is a circuit diagram illustrating a control circuit in the sixth embodiment of the semiconductor memory device.

A control circuit 12B is constituted of "j+1" non-volatile memory cells arranged for example as shown in FIG. 19. As shown in FIG. 19, each non-volatile memory cell is a non-volatile SRAM (static RAM) constituted by adding a pair of ferroelectric capacitors and a plate line PLC to the volatile memory cells RMC0 shown in FIG. 3.

Namely, a memory cell RMC0 shown in FIG. 19 includes two inverters INV21 and 1NV22 each having an input connected to an output of the other inverter so as to form a latch circuit, and transfer gate nMOS transistors N21 and N22 having a gate connected to a write control line WLC. One end of the transfer gate nMOS transistors N21 and N22 ate respectively connected to a pair of complementary output lines DR0 and /DR0 of the corresponding sense amplifier SA0. The other end of the transfer gate nMOS transistors N21 and N22 are respectively connected to two connection nodes of the inverters INV21 and INV22 connected to each other in opposite direction. A pair of ferroelectric capacitors FC11 and FC12 are connected between the two connection nodes of the inverters INV21 and INV22 and a plate line PLC, respectively. The control signal CS0 is outputted from the connection node between the nMOS transistor N21 and the inverters. The other memory cells RMCk (k=1 to j) have a similar construction, but receive a pair of outputs DRk and /DRk (k=1 to j) of the associated sense amplifier, and output the control signal CSk (k=1 to j), respectively.

The ferroelectric capacitors can be formed directly above the memory cell, and therefore, the chip area does not increase by addition of the ferroelectric capacitors.

The substitution information can be written into the non-volatile memory cells of the control circuit 12B by bringing the write control line WLC to the high level "H" and by action of the sense amplifiers SA0 to SAj through the sense amplifier output lines DR0 and /DR0 to DRj and /DRj.

Figure 20:
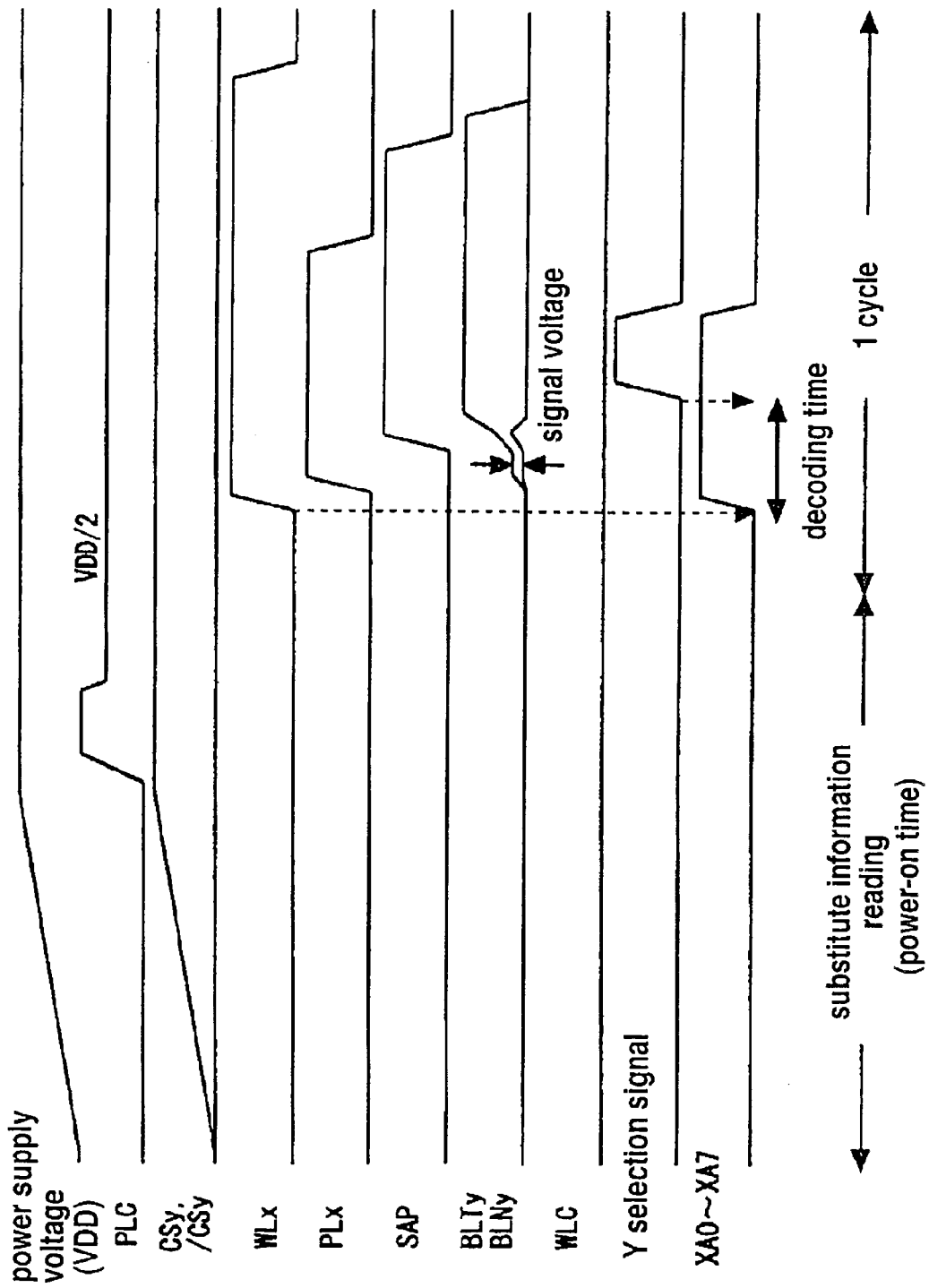
FIG. 20 is a timing chart illustrating the operation of the sixth embodiment of the semiconductor memory device.

Now, an operation of the circuits shown in FIGS. 18 and 19 will be described with a timing chart of FIG. 20.

When the power supply is turned on for the memory chip so that it begins to supply a power supply voltage to the non-volatile memory cells RMC0 to RMCj shown in FIG. 19, the reading of the substitution information starts substantially simultaneously.

Since the two inverters within each of the non-volatile memory cells RMC0 to RMCj shown in FIG. 19 are the same as the sense amplifier shown in FIG. 14, the substitution information is read out from the ferroelectric capacitors in a manner similar to the substitution information reading manner in the fourth embodiment.

After the substitution information has been read out, the potential of the plate line PLC is brought to VDD/2 after the potential of the plate line PLC has been brought to VDD (high level "H") once.

Thus, the substitution information is rewritten into the ferroelectric capacitors. After the completion of the rewriting, the ordinary reading of the memory cells becomes possible. Therefore, the substitution of the defective column is carried out in accordance with the control signals CS0 to CSj, similarly to the embodiments mentioned above.

As seen from the above, in this sixth embodiment, the procedure for reading the substitution information can be simplified specially. In addition, the area of the control circuit 12B is not increased by addition of the ferroelectric capacitors, since the ferroelectric capacitors can be formed directly above the memory cell. In other word, the control circuit 12B can be realized with the same area as that of the control circuit in the other embodiments, and on the other hand, since no substitution information storing memory cell is formed in the memory cell array, the total area can be reduced.

In this sixth embodiment, the substitution information can be the address of the substitution column, similarly to the third embodiment mentioned above.

Figure 21:
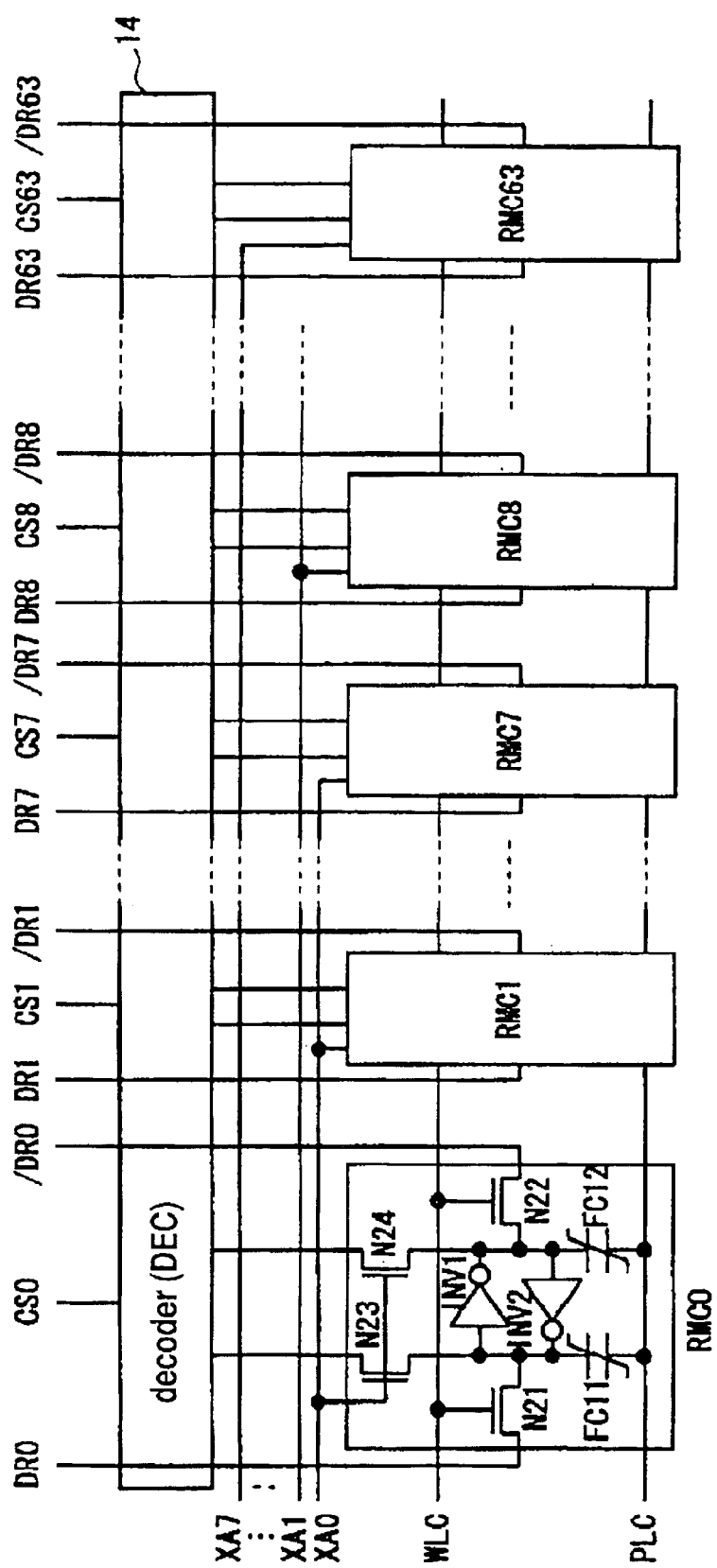
FIG. 21 is a block diagram of a seventh embodiment of the semiconductor memory device in accordance with the present invention.
Figure 22:
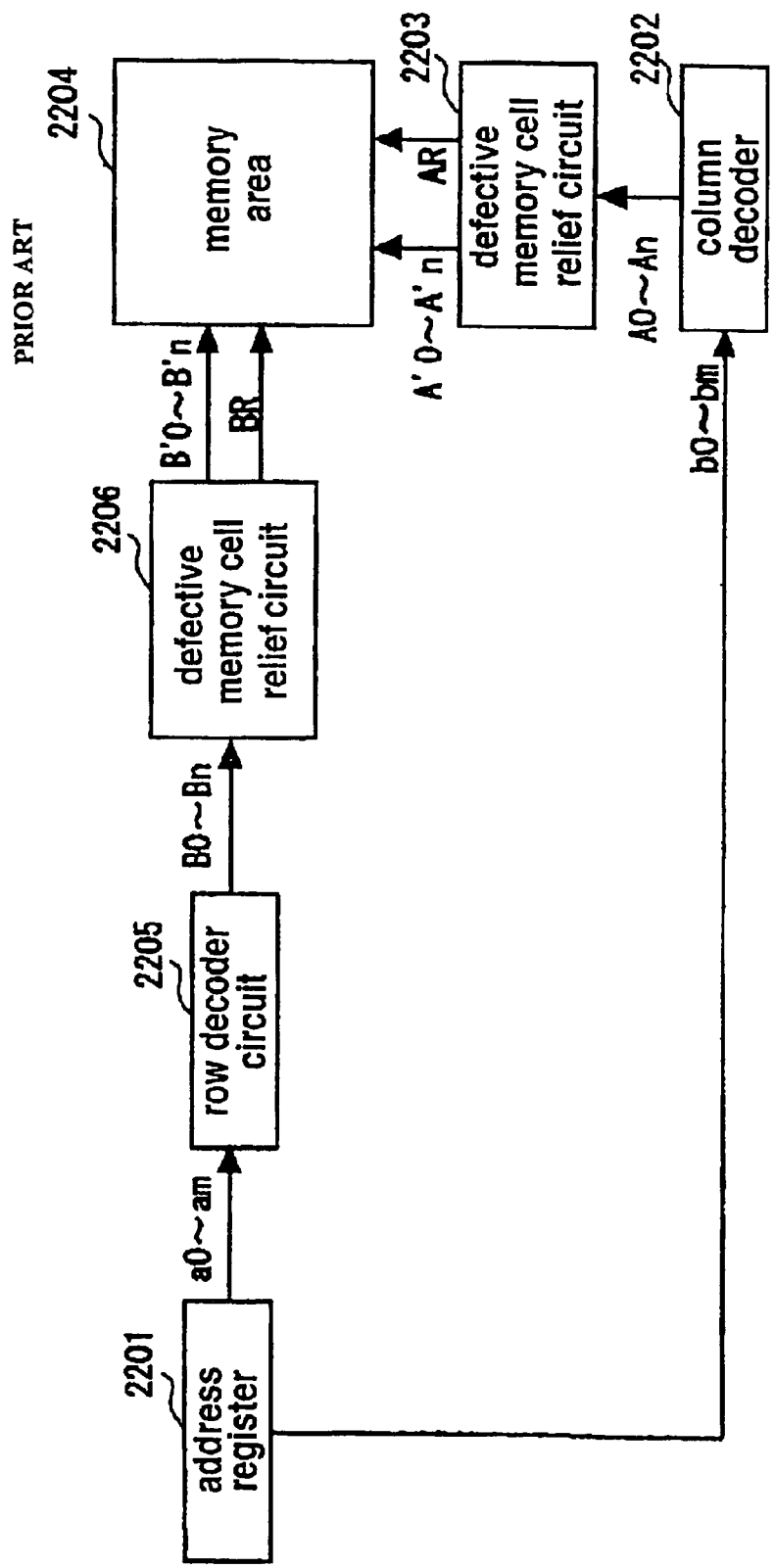
FIG. 22 is a block diagram illustrating the prior art defective memory cell relief circuit.
Figure 23:
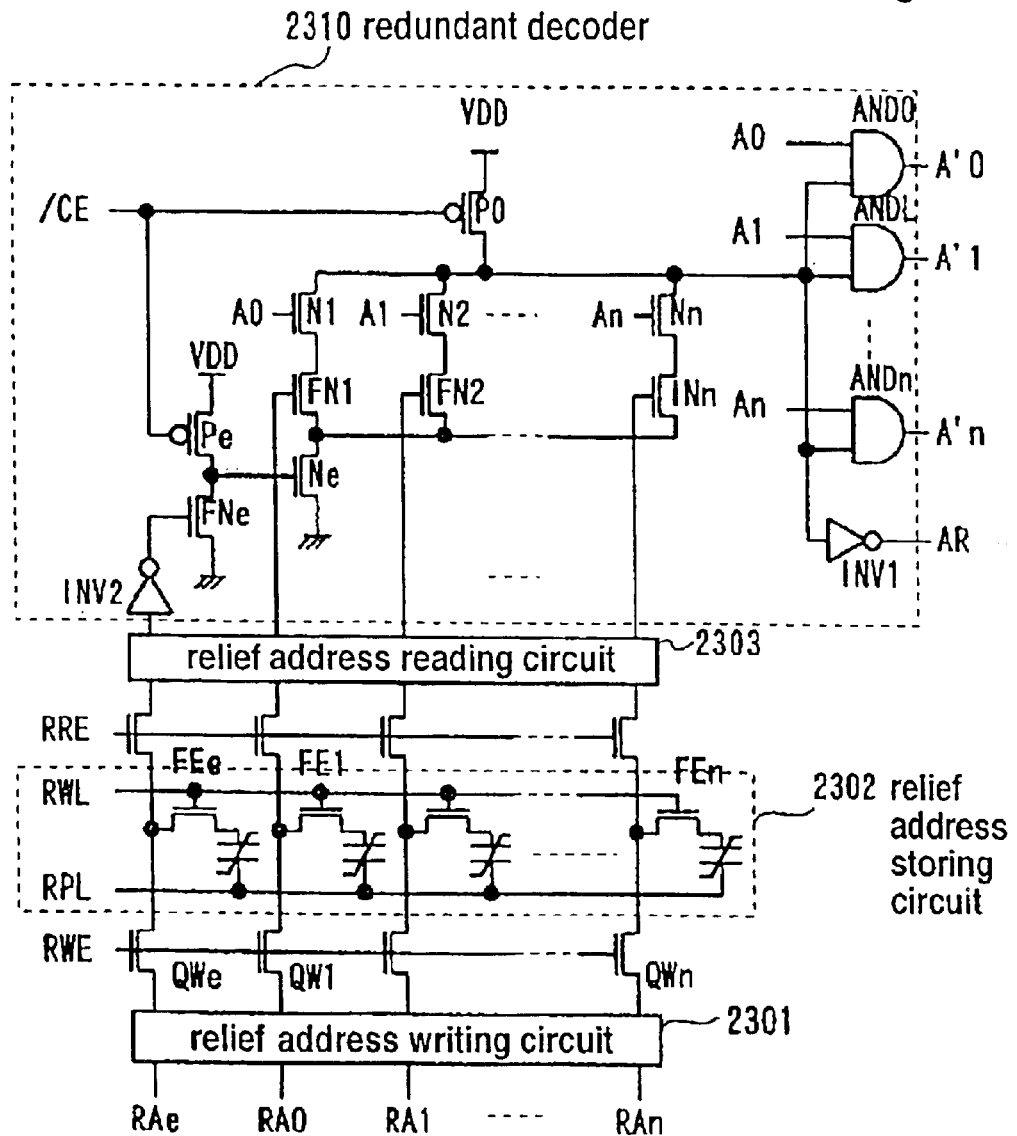
FIG. 23 is a circuit diagram illustrating the prior art defective memory cell relief circuit.

In this case, the control circuit 12B is modified as shown in FIG. 21. The control circuit 12B shown in FIG. 21 includes the substitution information storing memory cells RMC0 to RMC63 (corresponding to RMC0 to RMCj) and a decoder 14 for generating the control signals CS0 to CS63 (corresponding to CS0 to CSj). This is a seventh embodiment of the present invention.

In this seventh embodiment, similarly to the third embodiment, the decoding into the control signal can be carried out in a period from the activation of the word line to the activation of the Y selection signal, with the result that no overhead occurs in the access time.

In the above mentioned embodiments, the ferroelectric memory device using the 2-transistor, 2-capacitor type memory cells are used. However, the present invention can be equally applied to a ferroelectric memory device which uses 1-transistor, 1-capacitor type memory cells.

Furthermore, the present invention can be applied to not only the ferroelectric memory device but also other non-volatile memories such as an EEPROM (electrically erasable programmable read only memory), a flash memory, a MRAM (magnetic random access memory) and volatile memories such as a DRAM (dynamic random access memory) and an SRAM (static random access memory).

As seen from the above, according to the present invention, not only the increase of the area is minimized but also the overhead in time in the memory cell reading/writing operation is suppressed, in comparison with the prior art in which the substitution information is programmed by the fuses and the prior art in which the substitution information is programmed by using the ferroelectric capacitors Furthermore, according to the present invention, there occurs no characteristics deterioration in the substitution information cells due to fatigue or imprint. Therefore, the yield of production and the reliability of the semiconductor memory device chip can be remarkably elevated.

The invention has thus been shown and described with reference to the specific embodiments. However, it should be noted that the present invention is in no way limited to the details of the illustrated structures but changes and modifications may be made within the scope of the appended claims.

What is claimed is:

1. A semiconductor memory including first and second memory cell arrays each constituted of a number of memory cells arranged in the form of a matrix having a number of rows and a number of columns, and a defective memory cell relief means, wherein each of said first and second memory cell arrays includes main memory cells arranged in the form of a matrix having a number of rows and a number of columns, at least one row of substitution information storing memory cells and at least one column of redundant memory cells, the substitution information for said first memory cell array being stored in said substitution information storing memory cells in said second memory cell array, the substitution information for said second memory cell array being stored in said substitution information storing memory cells in said first memory cell array, so that when said first memory cell array is accessed, substitution information is simultaneously read out from said substitution information storing memory cells in said second memory cell array in order to relieve a defective memory cell within said first memory cell array.

2. A semiconductor memory claimed in claim 1 wherein only said substitution information storing memory cells are a non-volatile memory cell.

3. A semiconductor memory claimed in claim 1 wherein said main memory cells, said redundant memory cells and said substitution information storing memory cells are a non-volatile memory cell.

4. A semiconductor memory claimed in claim 3 wherein said non-volatile memory cell is a ferroelectric non-volatile memory cell.

* * * * *